US 9,064,853 B2

(12) United States Patent
Nomura et al.

(10) Patent No.: US 9,064,853 B2
(45) Date of Patent: Jun. 23, 2015

(54) SEMICONDUCTOR DEVICE AND METHOD FOR MANUFACTURING THE SAME

(75) Inventors: Masafumi Nomura, Tochigi (JP);
Kenichi Okazaki, Tochigi (JP);
Toshiyuki Miyamoto, Konuma (JP);
Takashi Hamochi, Shimotsuga (JP);
Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/572,847

(22) Filed: Aug. 13, 2012

(65) Prior Publication Data
US 2013/0043466 A1    Feb. 21, 2013

(30) Foreign Application Priority Data

Aug. 19, 2011   (JP) ................. 2011-179660

(51) Int. Cl.
*H01L 27/12*     (2006.01)
*H01L 29/12*     (2006.01)
(Continued)

(52) U.S. Cl.
CPC ...... *H01L 29/4908* (2013.01); *H01L 29/78606* (2013.01); *H01L 29/7869* (2013.01); *H01L 29/78693* (2013.01); *H01L 29/66969* (2013.01)

(58) Field of Classification Search
CPC ... H01L 29/7869; H01L 29/04; H01L 29/786; H01L 27/1225; H01L 27/3211; H01L 27/3262; H01L 27/324; H01L 21/336
USPC ............ 257/43, 32, 57, 59, 66, 72, 410, 637, 257/646, E29.003, E29.296, E29.299, 257/E21.471, E33.001; 438/104
See application file for complete search history.

(56) References Cited

U.S. PATENT DOCUMENTS 5,731,856 A    3/1998    Kim et al.
5,744,864 A    4/1998    Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.
(Continued)

*Primary Examiner* — Chuong A Luu
*Assistant Examiner* — Moazzam Hossain
(74) *Attorney, Agent, or Firm* — Eric J. Robinson; Robinson Intellectual Property Law Office, P.C.

(57) ABSTRACT

A semiconductor device including an oxide semiconductor and including a more excellent gate insulating film is provided. A highly reliable and electrically stable semiconductor device having a small number of changes in the film structure, the process conditions, the manufacturing apparatus, or the like from a mass production technology that has been put into practical use is provided. A method for manufacturing the semiconductor device is provided. The semiconductor device includes a gate electrode, a gate insulating film formed over the gate electrode, and an oxide semiconductor film formed over the gate insulating film. The gate insulating film includes a silicon nitride oxide film, a silicon oxynitride film formed over the silicon nitride oxide film, and a metal oxide film formed over the silicon oxynitride film. The oxide semiconductor film is formed over and in contact with the metal oxide film.

10 Claims, 15 Drawing Sheets

(51) Int. Cl.
  *H01L 29/49* (2006.01)
  *H01L 29/786* (2006.01)
  *H01L 29/66* (2006.01)

(56) References Cited

U.S. PATENT DOCUMENTS

| | | | |
|---|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,274,078 B2 | 9/2012 | Itagaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0023698 A1* | 1/2008 | Li et al. ............ 257/43 |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0127266 A1* | 5/2010 | Saito et al. ............ 257/59 |
| 2010/0320458 A1 | 12/2010 | Umeda et al. |
| 2010/0320459 A1 | 12/2010 | Umeda et al. |
| 2011/0180802 A1* | 7/2011 | Morosawa et al. ............ 257/59 |
| 2012/0032193 A1* | 2/2012 | Kurokawa et al. ............ 257/84 |
| 2013/0208207 A1* | 8/2013 | Okamoto et al. ............ 349/46 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-033172 A | 2/2005 |
| JP | 2006-165528 A | 6/2006 |
| JP | 2006-229185 A | 8/2006 |
| JP | 2010-114413 A | 5/2010 |
| WO | WO-2004/114391 | 12/2004 |
| WO | WO-2010/041686 | 4/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar

(56) References Cited

OTHER PUBLICATIONS

Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High Performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

OHara.H et al., "Amorphous In—Ga—Zn—Oxide TFTs With Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Usinhg Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

OHara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A, Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDS '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE AND METHOD FOR MANUFACTURING THE SAME

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic appliance are all semiconductor devices.

2. Description of the Related Art

A technology by which transistors are formed using semiconductor thin films over a substrate having an insulating surface has been attracting attention. Such transistors are applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor is disclosed in which a semiconductor thin film is formed using an amorphous oxide containing indium (In), gallium (Ga), and zinc (Zn) and having an electron carrier concentration lower than $10^{18}/cm^3$ (for example, see Patent Document 1).

On the other hand, as well as a semiconductor thin film, a gate insulating film influences performance of a transistor. As characteristics needed for a gate insulating film, for example, low threshold voltage, high withstand voltage, excellent interface properties with a semiconductor thin film, or the like can be given. When a silicon-based semiconductor material is used for a semiconductor thin film, a silicon oxide film which has excellent interface properties with the silicon-based semiconductor material is used.

As a gate insulating film for a top-gate transistor in which a silicon-based semiconductor material is used for a semiconductor thin film, a gate insulating film in which a silicon oxide film and a silicon nitride film are stacked is disclosed (for example, see Patent Document 2).

A gate insulating film in which a silicon nitride film and a silicon oxide film are stacked can have a larger thickness than a single-layer gate insulating film of silicon oxide because a nitride silicon film having a higher dielectric constant than a silicon oxide film can be used as part of the gate insulating film. When the thickness of the gate insulating film is made large, a withstand voltage of the gate insulating film can be improved.

REFERENCE

Patent Document

[Patent Document 1] Japanese Published Patent Application No. 2006-165528
[Patent Document 2] Japanese Published Patent Application No. 2006-229185

SUMMARY OF THE INVENTION

In consideration of cost and speed for development for mass production of semiconductor devices including oxide semiconductors, it is preferable to utilize mass-production technology currently in practical use, i.e., a film structure, process conditions, a production apparatus, or the like for a semiconductor thin film of a silicon-based semiconductor material such as amorphous silicon or polycrystalline silicon.

However, carrier generating mechanism of an oxide semiconductor is greatly different from that of a silicon-based semiconductor material. A physical property unique to the oxide semiconductor greatly affects characteristics or reliability of a transistor.

In particular, when a gate insulating film of a semiconductor device including the silicon-based semiconductor material used for a semiconductor thin film is used for a semiconductor device including an oxide semiconductor, the gate insulating film does not have excellent interface properties with the oxide semiconductor. Accordingly, for a semiconductor device including an oxide semiconductor, development of a more excellent gate insulating film has been needed.

In view of the above problems, one object of one embodiment of the present invention is to provide a semiconductor device including an oxide semiconductor and including a more excellent gate insulating film. Another object of one embodiment of the present invention is to provide a highly reliable and electrically stable semiconductor device with a small number of changes in the film structure, the process conditions, the manufacturing apparatus, or the like from the mass production technology that has been put into practical use. Further, another object is to provide a method for manufacturing the semiconductor device.

In the semiconductor device including the oxide semiconductor film, a metal oxide film is provided as a base film in contact with the oxide semiconductor film. The metal oxide film is formed using a material containing an element belonging to the same group as the constituent element of the oxide semiconductor film. Since the metal oxide film and the oxide semiconductor film include the element belonging to the same group in the periodic table, the interface properties are very stable. Further, the metal oxide film can suppress entry of water or hydrogen from the outside.

Further, in the semiconductor device including the oxide semiconductor film, if the transistor has a bottom gate structure, the base film of the oxide semiconductor film is a gate insulating film. In other words, by providing the metal oxide film as the base film of the oxide semiconductor film, the interface properties are very stable and a more excellent gate insulating film can be provided. Details of the semiconductor device are described below.

One embodiment of the present invention is a semiconductor device including a gate electrode, a gate insulating film formed over the gate electrode, and an oxide semiconductor film formed over the gate insulating film. The gate insulating film includes a silicon nitride oxide film, a silicon oxynitride film formed over the silicon nitride oxide film, and a metal oxide film formed over the silicon oxynitride film. The oxide semiconductor film is formed over and in contact with the metal oxide film.

When the silicon nitride oxide film, the silicon oxynitride film, and the metal oxide film and the oxide semiconductor film are provided in this order, the films at the interfaces are compatible with each other and the interface properties are excellent. Such a stacked-layer structure from the silicon nitride oxide film to the metal oxide film makes it possible to form a high-quality gate insulating film with low threshold voltage, high withstand voltage, and excellent interface properties with the oxide semiconductor film. Further, the silicon nitride oxide film and the silicon oxynitride film can be formed using the film structure, the process conditions, the manufacturing apparatus, or the like for a conventional silicon-based semiconductor material, which is preferable.

Further, when the oxide semiconductor film is formed over the metal oxide film, the crystallinity of the oxide semiconductor film is improved, which is preferable. For example, when the silicon oxynitride film and the oxide semiconductor film are in contact with each other to form the gate insulating film, the silicon oxynitride film might inhibit crystallization of the oxide semiconductor film near the interface with the oxide semiconductor film because the silicon oxynitride film and the oxide semiconductor film contain elements belonging to the different groups. On the other hand, since the metal oxide film contains an element belonging to the same group as the oxide semiconductor film, the metal oxide film does not inhibit crystallization of the oxide semiconductor film near the interface with the oxide semiconductor film.

Further, in the above-described structure, a source electrode and a drain electrode which are formed over the oxide semiconductor film or a protective film which is formed over the source electrode, the drain electrode, and the oxide semiconductor film may be further provided.

Further, in the above-described structure, the metal oxide film is an aluminum oxide film. The aluminum oxide film preferably has a film density of higher than or equal to 3.2 g/cm$^3$, further preferably higher than or equal to 3.6 g/cm$^3$.

When the metal oxide film is the aluminum oxide film and the film density of the aluminum oxide film is in the above-described range, permeation of water or hydrogen contained in the silicon nitride oxide film or the silicon oxynitride film formed below the metal oxide film can be suppressed. In other words, the metal oxide film can suppress entry of water or hydrogen from the lower side into the oxide semiconductor film formed over the metal oxide film.

Further, another embodiment of the present invention is a method for manufacturing a semiconductor device which includes the following steps: forming a gate electrode over a glass substrate; forming a silicon nitride oxide film over the gate electrode; forming a silicon oxynitride film over the silicon nitride oxide film; performing heat treatment after the silicon oxynitride film is formed; forming a metal oxide film over the silicon oxynitride film; and forming an oxide semiconductor film over the metal oxide film. The silicon nitride oxide film and the silicon oxynitride film are formed successively in a vacuum. The metal oxide film and the oxide semiconductor film are formed successively in a vacuum.

When the silicon nitride oxide film and the silicon oxynitride film are formed successively in a vacuum, entry of impurities into the interface can be suppressed. Further, when the metal oxide film and the oxide semiconductor film are formed successively in a vacuum, entry of impurities into the interface can be suppressed. When the oxide semiconductor film is formed while heated, the oxide semiconductor film can be crystallized from the interface between the oxide semiconductor film and the metal oxide film.

Further, another embodiment of the present invention is a method for manufacturing a semiconductor device which includes the following steps: forming a gate electrode over a glass substrate; forming a silicon nitride oxide film over the gate electrode; forming a silicon oxynitride film over the silicon nitride oxide film; performing heat treatment after the silicon oxynitride film is formed; forming a metal oxide film over the silicon oxynitride film; forming an oxide semiconductor film over the metal oxide film; forming a source electrode and a drain electrode over the oxide semiconductor film; and forming a protective film after the source electrode and the drain electrode are formed. The silicon nitride oxide film and the silicon oxynitride film are formed successively in a vacuum. The metal oxide film and the oxide semiconductor film are formed successively in a vacuum.

Further, in each of the above-described structures, the silicon nitride oxide film is preferably thicker than the silicon oxynitride film.

When the silicon nitride oxide film is thicker than the silicon oxynitride film, the coverage of unevenness due to a step portion of the gate electrode can be improved. Further, with such a structure, a thickness needed for obtaining capacitance equivalent to that of a single layer of the silicon nitride oxide film or the silicon oxynitride film is made large, so that a decrease in withstand voltage can be suppressed.

Further, in each of the above-described structures, the oxide semiconductor film preferably contains at least one of oxides of indium, zinc, gallium, zirconium, tin, gadolinium, titanium, and cerium. In particular, it is preferable that the oxide semiconductor film include oxide containing either indium or zinc.

Further, in each of the above-described structures, the metal oxide film preferably contains at least one of oxides of aluminum, zinc, and gallium.

Further, in each of the above-described structures, the heat treatment is preferably performed at higher than or equal to 200° C. and lower than or equal to 450° C. under a nitrogen atmosphere or in a vacuum. Note that in this specification or the like, "in a vacuum" indicates a state in which pressure is made at least lower than atmospheric pressure (e.g., lower than or equal to $1.0 \times 10^{-1}$ Pa).

A semiconductor device including an oxide semiconductor and including a more excellent gate insulating film can be provided. A highly reliable and electrically stable semiconductor device can be provided with a small number of changes in the film structure, the process conditions, the manufacturing apparatus, or the like from the mass production technology that has been put into practical use. Further, a method for manufacturing the semiconductor device can be provided.

DETAILED DESCRIPTION OF THE INVENTION

Figure 1A:
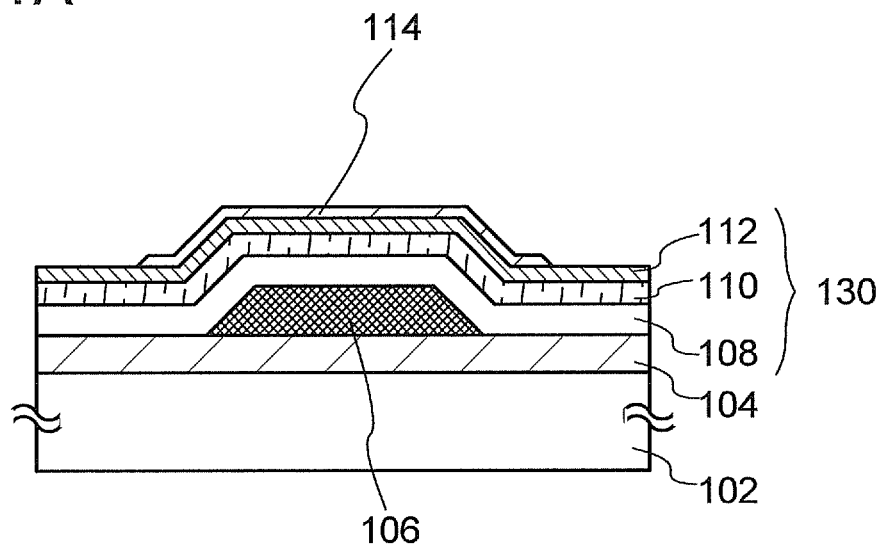
FIGS. 1A and 1B are cross-sectional views illustrating embodiments of a semiconductor device.

Hereinafter, embodiments of the present invention are described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Further, in embodiments hereinafter described, the same parts are denoted with the same reference numerals throughout the drawings. Note that components illustrated in the drawings, that is, a thickness or a width of a layer, a region, or the like, a relative position, and the like are exaggerated in some cases for clarification in description of embodiments.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Further, in this specification or the like, a silicon nitride oxide film is a film containing nitrogen, oxygen, and silicon as its components and containing more nitrogen than oxygen. Further, a silicon oxynitride film is a film containing oxygen, nitrogen, and silicon as its components and containing more oxygen than nitrogen.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Embodiment 1

In this embodiment, one embodiment of a semiconductor device is described with reference to FIGS. 1A and 1B. In this embodiment, a cross-sectional view of the semiconductor device including an oxide semiconductor film is shown.

The semiconductor device illustrated in FIG. 1A includes a substrate 102, a base insulating film 104 formed over the substrate 102, a gate electrode 106 formed over the base insulating film 104, a silicon nitride oxide film 108 formed over the base insulating film 104 and the gate electrode 106, a silicon oxynitride film 110 formed over the silicon nitride oxide film 108, a metal oxide film 112 formed over the silicon oxynitride film 110, and an oxide semiconductor film 114 formed over the metal oxide film 112.

The silicon nitride oxide film 108, the silicon oxynitride film 110, and the metal oxide film 112 form a gate insulating film 130.

Further, the thickness of the silicon oxynitride film 110 is smaller than that of the silicon nitride oxide film 108. The coverage with the silicon nitride oxide film 108 is higher than that with the silicon oxynitride film 110 at a step portion or the like. That is, the silicon nitride oxide film 108 can cover a step portion of the gate electrode 106. Further, because the dielectric constant of the silicon nitride oxide film 108 is higher than that of the silicon oxynitride film 110, a thickness needed for obtaining capacitance equivalent to that of a single layer of the silicon nitride oxide film or the silicon oxynitride film can be made large. That is, the silicon nitride oxide film 108 can be formed thicker than the silicon oxynitride film 110.

The metal oxide film 112 is formed using a material which contains an element belonging to Group 12 or Group 13, or an element of Group 3 having a property similar to that of the element of Group 13, which is the same group as one of the constituent element of the oxide semiconductor film 114. For example, when the oxide semiconductor film 114 is an oxide semiconductor material containing an oxide of indium and zinc, the metal oxide film 112 is preferably an insulating metal oxide film containing an element belonging to the same group as zinc, namely, Group 12, an element belonging to the same group as indium, namely, Group 13, or an element of Group 3 a property similar to that of the element of Group 13. As the element of Group 3 contained in the metal oxide film 112, a lanthanum-based element such as cerium or gadolinium is preferably used. As the metal oxide film 112, an aluminum oxide film, a gallium oxide film, and a zinc oxide film can be selected as preferable examples.

Further, for the metal oxide film 112, an aluminum oxide film having a film density of higher than or equal to $3.2$ g/cm$^3$, preferably higher than or equal to $3.6$ g/cm$^3$, is preferably used. When an aluminum oxide film having a film density in the above range is used for the metal oxide film 112, entry of water and hydrogen from the outside can be suppressed.

That is, in this embodiment, the metal oxide film 112 can prevent absorbed moisture on a surface of the silicon oxynitride film 110 or hydrogen contained in the silicon oxynitride film 110 and the silicon nitride oxide film 108 which are formed below the metal oxide film 112 from entering the oxide semiconductor film 114 formed over the metal oxide film 112.

Further, when the silicon nitride oxide film 108, the silicon oxynitride film 110, the metal oxide film 112, and the oxide semiconductor film 114 are formed in this order, the films at the interfaces are compatible with each other and the interface properties are excellent. Such a stacked-layer structure from the silicon nitride oxide film 108 to the metal oxide film 112 makes it possible to form the gate insulating film 130 with low threshold voltage, high withstand voltage, and excellent interface properties with the oxide semiconductor film. Further, the silicon nitride oxide film 108 and the silicon oxynitride film 110 are preferable because they can be formed using the film structure, the process conditions, the manufacturing apparatus, or the like for a conventional silicon-based semiconductor material.

Further, when the oxide semiconductor film 114 is formed over the metal oxide film 112, the crystallinity of the oxide semiconductor film 114 is improved, which is preferable. For example, when the silicon oxynitride film 110 and the oxide semiconductor film 114 are in contact with each other to form a gate insulating film, the silicon oxynitride film 110 might inhibit crystallization of the oxide semiconductor film 114 near the interface with the oxide semiconductor film 114 because the silicon oxynitride film 110 and the oxide semiconductor film 114 contain elements belonging to the different groups. On the other hand, since the metal oxide film 112 contains an element belonging to the same group as the oxide semiconductor film 114, the metal oxide film 112 does not inhibit crystallization of the oxide semiconductor film 114 near the interface with the oxide semiconductor film 114.

Figure 1B:
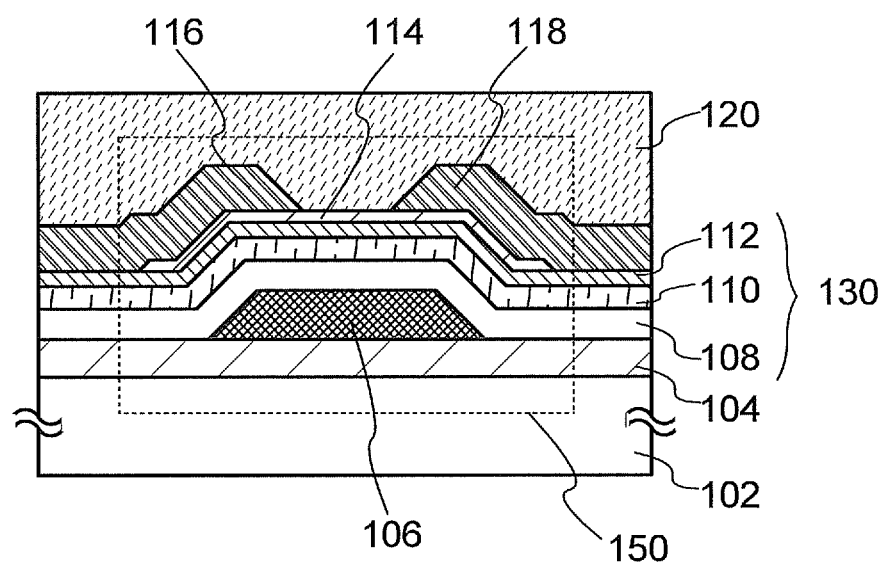

Next, the semiconductor device illustrated in FIG. 1B is described.

The semiconductor device illustrated in FIG. 1B has a structure in which a source electrode and a drain electrode are additionally provided to the semiconductor device illustrated in FIG. 1A to form a transistor, and a protective film is formed over the transistor.

The semiconductor device illustrated in FIG. 1B includes the substrate 102, the base insulating film 104 formed over the substrate 102, the gate electrode 106 formed over the base insulating film 104, the silicon nitride oxide film 108 formed over the base insulating film 104 and the gate electrode 106, the silicon oxynitride film 110 formed over the silicon nitride oxide film 108, the metal oxide film 112 formed over the silicon oxynitride film 110, the oxide semiconductor film 114 formed over the metal oxide film 112, a source electrode 116 formed over the metal oxide film 112 and the oxide semiconductor film 114, a drain electrode 118 formed over the metal oxide film 112 and the oxide semiconductor film 114, and the protective film 120 formed over the oxide semiconductor film 114, the source electrode 116, and the drain electrode 118.

The silicon nitride oxide film 108, the silicon oxynitride film 110, and the metal oxide film 112 form the gate insulating film 130.

The substrate 102, the base insulating film 104, the gate electrode 106, the silicon nitride oxide film 108, the silicon oxynitride film 110, the metal oxide film 112, the oxide semiconductor film 114, the source electrode 116, and the drain electrode 118 form the transistor 150.

Note that the gate insulating film 130 in the transistor 150 has the same structure as the gate insulating film 130 illustrated in FIG. 1A, and can be formed with reference to the above description.

Further, the source electrode 116 and the drain electrode 118 function as the source electrode and the drain electrode of the transistor 150. In this embodiment, a stacked structure of a titanium film, an aluminum film, and a titanium film can be used for the source electrode 116 and the drain electrode 118. When titanium films having a high melting point are provided below and over an aluminum film having a low melting point, the source electrode 116 and the drain electrode 118 can have high heat resistance.

The protective film 120 preferably prevents water or hydrogen from entering the oxide semiconductor film 114. Further, the protective film 120 is preferably capable of supplying oxygen to the oxide semiconductor film 114; for example, a silicon oxide film or the like containing more oxygen than the stoichiometric composition is preferably used as the protective film 120. A silicon oxide film containing more oxygen than the stoichiometric composition can provide oxygen to the oxide semiconductor film 114, so that generation of oxygen vacancies in the oxide semiconductor film 114 can be prevented.

As described above, in the semiconductor device which includes the oxide semiconductor and is described in this embodiment, the gate insulating film is formed using a silicon nitride oxide film, a silicon oxynitride film, and a metal oxide film. Further, the interface properties are excellent because the oxide semiconductor film is in contact with the metal oxide film. Further, the metal oxide film can suppress diffusion of impurities such as water or hydrogen from the lower side to the oxide semiconductor film. Thus, a more excellent gate insulating film can be provided for the semiconductor device including the oxide semiconductor.

Further, when a silicon nitride oxide film and a silicon oxynitride film are used as a gate insulating film, the number of changes in the film structure, the process conditions, the manufacturing apparatus, or the like from the mass production technology that has been put into practical use is small, stable electric characteristics are given to a semiconductor device, and a highly reliable semiconductor device can be provided.

This embodiment can be combined with any of the other embodiments as appropriate.

Embodiment 2

In this embodiment, a method for manufacturing the semiconductor device described in FIGS. 1A and 1B in Embodiment 1 is described with reference to FIGS. 2A to 2C and FIGS. 3A to 3C. Note that portions similar to those in FIGS. 1A and 1B are denoted by the same reference numerals, and description thereof is omitted.

Figure 2A:
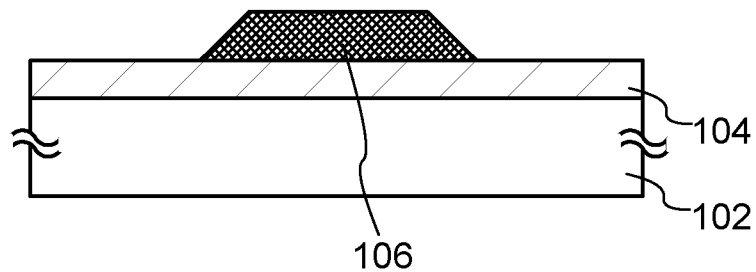
FIGS. 2A to 2C illustrate one embodiment of a method for manufacturing a semiconductor device.

First, the base insulating film 104 is formed over the substrate 102, and the gate electrode 106 is formed over the base insulating film 104 (see FIG. 2A).

For the substrate 102, a glass material such as aluminosilicate glass, aluminoborosilicate glass, or barium borosilicate glass is used. In the mass production, a mother glass with the following size is preferably used for the substrate 102: the 8-th generation (2160 mm×2460 mm); the 9-th generation (2400 mm×2800 mm, or 2450 mm×3050 mm); the 10-th generation (2950 mm×3400 mm); or the like. A mother glass considerably shrinks when the treatment temperature is high and the treatment time is long. Thus, in the case where mass production is performed with use of the mother glass, the heating temperature in the manufacturing process is preferably lower than or equal to 600° C., further preferably lower than or equal to 450° C., still further preferably lower than or equal to 350° C.

The base insulating film 104 is formed by a PE-CVD method or a sputtering method to have a thickness greater than or equal to 50 nm and less than or equal to 600 nm with the use of one of a silicon oxide film, a gallium oxide film, an aluminum oxide film, a silicon nitride film, a silicon oxynitride film, an aluminum oxynitride film, and a silicon nitride oxide film or a stacked-layer film including any of these films. The base insulating film 104 can suppress entry of impurities from the substrate 102 side. When the base insulating film 104 is not needed, for example, when absorbed moisture on the surface of the substrate 102 and moisture contained in the substrate 102 are little, the base insulating film 104 is not necessarily provided.

Next, after a conductive film is formed over the base insulating film 104, the gate electrode 106 is formed through a photolithography process and an etching step (see FIG. 2A). The gate electrode 106 can be formed by a sputtering method or the like to have a single-layer structure or a stacked-layer structure using a metal material such as molybdenum, titanium, tantalum, tungsten, aluminum, copper, neodymium, or scandium, or an alloy material containing any of these materials.

Figure 2B:
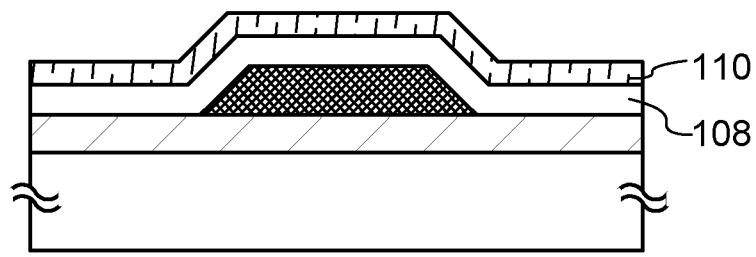

Next, the silicon nitride oxide film 108 and the silicon oxynitride film 110 are formed over the base insulating film 104 and the gate electrode 106 (see FIG. 2B).

The silicon nitride oxide film 108 and the silicon oxynitride film 110 can be formed successively in a vacuum using a PE-CVD apparatus. When the silicon nitride oxide film 108 and the silicon oxynitride film 110 are formed successively in a vacuum, entry of impurities into the interface can be suppressed.

The silicon nitride oxide film 108 and the silicon oxynitride film 110 can be formed using a gas such as $SiH_4$, $N_2O$, $NH_3$, or $N_2$. Further, the silicon nitride oxide film 108 is preferably thicker than the silicon oxynitride film 110.

When the silicon nitride oxide film 108 is thicker than the silicon oxynitride film 110, the coverage of unevenness due to a step portion of the gate electrode 106 can be improved. Further, with such a structure, a thickness needed for obtaining capacitance equivalent to that of a single layer of the silicon nitride oxide film or the silicon oxynitride film is made large, so that a decrease in withstand voltage can be suppressed.

Next, heat treatment is performed on the substrate 102 over which the silicon nitride oxide film 108 and the silicon oxynitride film 110 are formed.

For the heat treatment, an electric furnace or a device for heating an object to be processed by heat conduction or heat radiation from a heating element such as a resistance heating element can be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

Since the mother glass considerably shrinks when the treatment temperature is high and the treatment time is long, when a mother glass is used as the substrate 102, the heating temperature is preferably higher than or equal to 200° C. and lower than or equal to 450° C., further preferably higher than or equal to 250° C. and lower than or equal to 350° C.

Note that impurities such as water or hydrogen in the silicon nitride oxide film 108 and the silicon oxynitride film 110 can be removed by the heat treatment. Further, by the heat treatment, the defect density in the films can be reduced. The silicon nitride oxide film 108 and the silicon oxynitride film 110 function as part of the gate insulating film; thus, a reduction in the impurities or the defect density in the films leads to improved reliability of the semiconductor device. For example, degradation of the semiconductor device during a negative bias stress test with light irradiation, which is one of the reliability tests for semiconductor devices, can be suppressed.

Further, the heat treatment may be performed as pretreatment for formation of the metal oxide film 112 to be formed later. For example, after the silicon nitride oxide film 108 and the silicon oxynitride film 110 are formed, heat treatment is performed in a vacuum in a preheating chamber of a sputtering apparatus and the metal oxide film 112 and the oxide semiconductor film 113 are then formed.

Further, the heat treatment may be performed more than once. For example, after the silicon nitride oxide film 108 and the silicon oxynitride film 110 are formed, heat treatment is performed in a nitrogen atmosphere with an electric furnace or the like; then, after heat treatment is performed in a vacuum in a preheating chamber of a sputtering apparatus, the metal oxide film 112 and the oxide semiconductor film 113 are formed.

Figure 2C:
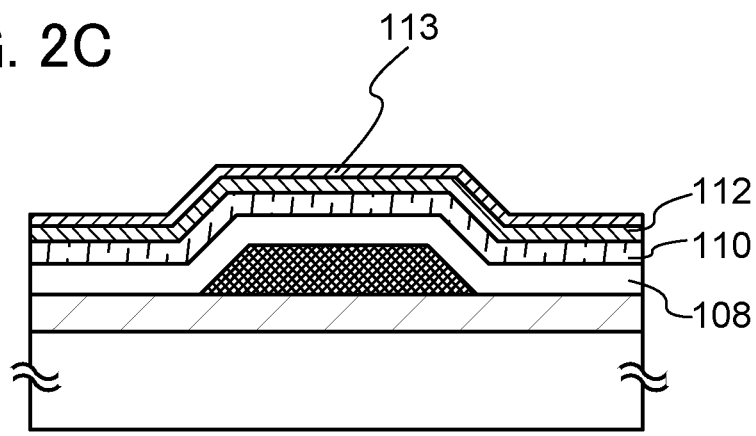

Next, the metal oxide film 112 and the oxide semiconductor film 113 are formed over the silicon oxynitride film 110 (see FIG. 2C).

The metal oxide film 112 and the oxide semiconductor film 113 can be formed successively in a vacuum with a multi-chamber sputtering apparatus.

In the case where heat treatment is performed before formation of the metal oxide film 112, the use of a multi-chamber sputtering apparatus makes it possible to successively perform heat treatment, the formation of the metal oxide film 112, and the formation of the oxide semiconductor film 113 in a vacuum.

Further, since the metal oxide film 112 is in contact with the oxide semiconductor film 113, the metal oxide film 112 is preferably formed using a material containing an element which belongs to the same group as one of the elements contained in the oxide semiconductor film 113. For example, when the oxide semiconductor film 113 contains an oxide of indium and zinc, the metal oxide film 112 is preferably an insulating metal oxide film containing an element belonging to the same group as zinc, namely, Group 12, an element belonging to the same group as indium, that is, Group 13 or a Group 3 element having a property similar to that of the element of Group 13. As the element of Group 3 contained in the metal oxide film 112, a lanthanum-based element such as cerium or gadolinium is preferably used. As the metal oxide film 112, an aluminum oxide film, a gallium oxide film, and a zinc oxide film can be selected as preferable examples.

The metal oxide film 112 can be formed by a sputtering method using a metal oxide target or a metal target. As atmosphere for sputtering, an inert gas atmosphere, an oxygen gas atmosphere, a mixed gas atmosphere of an inert gas and an oxygen gas, or the like can be used. Examples of a sputtering method include an RF sputtering method in which a high-frequency power source is used as a sputtering power source, a DC sputtering method in which a direct current source is used as a sputtering power source, and an AC sputtering method in which an alternating current source is used as a sputtering power source. Further, a pulsed DC sputtering method in which a bias is applied in a pulsed manner can also be used. An RF sputtering method or an AC sputtering method is preferably used in order to form the metal oxide film 112 dense. The substrate is preferably heated when the metal oxide film 112 is formed in order to form the metal oxide film 112 dense.

In the formation process of the metal oxide film 112 and the oxide semiconductor film 113, in order to prevent the metal oxide film 112 and the oxide semiconductor film 113 from containing hydrogen or water, as pretreatment for forming the metal oxide film 112, it is preferable that heat treatment be performed on the substrate 102 over which the silicon oxynitride film 110 is formed in a preheating chamber of a sputtering apparatus, that is, in a vacuum, and impurities such as hydrogen, water, or the like attached to the substrate 102 and the silicon oxynitride film 110 be eliminated and exhausted. As an exhaustion unit provided in the preheating chamber, a cryopump is preferable.

The oxide semiconductor film 113 preferably contains at least indium (In) or zinc (Zn). In particular, In and Zn are preferably contained. In addition, as a stabilizer for reducing the variation in electric characteristics of a transistor using the oxide, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor film 113, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For the oxide semiconductor film 113, a material expressed as the chemical formula I $nMO_3(ZnO)_m$ (m>0, m is not an integer) may be used. Note that M represents one or more metal elements selected from Ga, Fe, Mn, and Co. Alternatively, as the oxide semiconductor, a material expressed by a chemical formula, $In_2SnO_5(ZnO)_n$ (n>0, n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, the mobility can be increased by reducing the defect density in the bulk also in the case of using the In—Ga—Zn-based oxide.

For example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \le r^2$. For example, r may be 0.05. The same applies to other oxides.

The oxide semiconductor film 113 may be either single crystal or non-single-crystal. In the latter case, the oxide semiconductor may be either amorphous or polycrystalline.

Further, the oxide semiconductor may have either an amorphous structure including a portion having crystallinity or a non-amorphous structure.

It is relatively easy to make a surface of an amorphous oxide semiconductor film flat. Thus, when a transistor is manufactured with the use of the oxide semiconductor, interface scattering can be reduced, and relatively high mobility can be obtained relatively easily.

In the crystalline oxide semiconductor film, defects in the bulk can be further reduced, and mobility higher than that of an amorphous oxide semiconductor film can be obtained when a surface flatness is improved. In order to improve the surface flatness, the oxide semiconductor film is preferably formed on a flat surface. Specifically, the oxide semiconductor film is preferably formed on a surface with an average surface roughness (Ra) of less than or equal to 1 nm, preferably less than or equal to 0.3 nm.

As the oxide semiconductor film 113, an oxide semiconductor film including a crystal and having crystallinity (crystalline oxide semiconductor film) can be used. A crystalline state in a crystalline oxide semiconductor film may be a state in which crystal axes are oriented in random directions or a state in which crystal axes are oriented in a certain direction.

As the crystalline oxide semiconductor film, for example, a c-axis aligned crystalline oxide semiconductor (CAAC-OS) film can be used.

The CAAC-OS film is not completely single crystal nor completely amorphous. The CAAC-OS film is an oxide semiconductor film with a crystal-amorphous mixed phase structure where crystalline portions are included in an amorphous phase. Note that in most cases, the crystalline portion fits inside a cube whose one side is less than 100 nm. From an observation image obtained with a transmission electron microscope (TEM), a boundary between an amorphous portion and a crystalline portion in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystalline portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystalline portions, the directions of the a-axis and the b-axis of one crystalline portion may be different from those of another crystalline portion. In this specification, a simple term "perpendicular" includes a range from 85° to 95°. In addition, a simple term "parallel" includes a range from −5° to 5°.

In the CAAC-OS film, distribution of crystalline portions is not necessarily uniform. For example, in the formation process of the CAAC-OS film, in the case where crystal growth occurs from a surface side of the oxide semiconductor film, the proportion of crystalline portions in the vicinity of the surface of the oxide semiconductor film is higher than that in the vicinity of the surface where the oxide semiconductor film is formed in some cases. Further, when impurities are added to the CAAC-OS film, the crystalline portion in a region to which the impurities is added becomes amorphous in some cases.

Since the c-axes of the crystalline portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystalline portion is the direction parallel to a normal vector of the surface where the CAAC-OS film is formed or a normal vector of the surface of the CAAC-OS film. The crystalline portion is formed by film formation or by performing crystallization treatment such as heat treatment after film formation.

With the use of the CAAC-OS film in a transistor, change in electric characteristics of the transistor due to irradiation with visible light or ultraviolet light can be reduced. Thus, the transistor has high reliability.

There are three methods for obtaining a CAAC-OS film when the CAAC-OS film is used as the oxide semiconductor film 113. The first method is to form an oxide semiconductor film at a film formation temperature higher than or equal to 100° C. and lower than or equal to 450° C., preferably higher than or equal to 150° C. and lower than or equal to 400° C., thereby obtaining c-axis alignment substantially perpendicular to a surface. The second method is to form a thin oxide semiconductor film and then subject the film to heat treatment performed at a temperature higher than or equal to 200° C. and lower than or equal to 700° C., thereby obtaining c-axis alignment substantially perpendicular to a surface. The third method is to form a first thin oxide semiconductor film, subject the film to heat treatment performed at a temperature higher than or equal to 200° C. and lower than or equal to 700° C., and then form a second oxide semiconductor film, thereby obtaining c-axis alignment substantially perpendicular to a surface.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

Note that when an oxide semiconductor film (single crystal or microcrystalline) having crystallinity different from the CAAC-OS film is formed as the oxide semiconductor film 113, the film formation temperature is not particularly limited.

The energy gap of the oxide semiconductor film 113 is 2.8 eV to 3.2 eV, and is greater than that of silicon (1.1 eV). The intrinsic carrier density of the oxide semiconductor film 113 is $10^{-9}/cm^3$, which is much smaller than that of silicon ($10^{11}/cm^3$).

Majority carriers (electrons) of the oxide semiconductor film 113 are only carriers which flow from a source of the transistor because carriers which are thermally excited at a practical operation temperature do not exist when the oxide semiconductor film 113 has the above-described intrinsic carrier density. Further, a channel formation region can be depleted completely. Thus, an off-state current of the transistor can be extremely small. The off-state current of the transistor including the oxide semiconductor film 113 is as small as 10 yA/μm or less at room temperature, or 1 zA/μm or less at 85° C. to 95° C.

Further, in this embodiment, the metal oxide film 112 is provided as a base film of the oxide semiconductor film 113. When the metal oxide film 112, which contains an element belonging to the same group as an element contained in the oxide semiconductor film 113, is provided, the crystallinity of the oxide semiconductor film 113 can be improved. In particular, the crystallinity of the oxide semiconductor film 113 near the interface with the metal oxide film 112 can be improved. For example, when a base film of the oxide semiconductor film 113 is a silicon oxynitride film, the crystallinity of the oxide semiconductor film 113 near the interface with the silicon oxynitride film is lowered in some cases. This embodiment has a favorable structure in which a metal oxide film is used as a base film of the oxide semiconductor film 113, and thus the crystallinity of the oxide semiconductor film 113 can be improved.

Further, for the metal oxide film 112, an aluminum oxide film having a film density of higher than or equal to 3.2 g/cm³, preferably higher than or equal to 3.6 g/cm³, is preferably used. When an aluminum oxide film having a film density in the above range is used for the metal oxide film 112, entry of water and hydrogen from the outside can be suppressed.

That is, in this embodiment, the metal oxide film 112 can prevent absorbed moisture on a surface of the silicon oxynitride film 110 or hydrogen contained in the silicon oxynitride film 110 and the silicon nitride oxide film 108 which are formed below the metal oxide film 112 from entering the oxide semiconductor film 114 formed over the metal oxide film 112.

The oxide semiconductor film 113 has a thickness greater than or equal to 1 nm and less than or equal to 200 nm (preferably greater than or equal to 15 nm and less than or equal to 30 nm) and can be formed by a sputtering method, a molecular beam epitaxy (MBE) method, a CVD method, a pulsed laser deposition method, an atomic layer deposition (ALD) method, or the like as appropriate. The oxide semiconductor film 113 may be formed with a sputtering apparatus which performs film formation with surfaces of a plurality of substrates set substantially perpendicular to a surface of a sputtering target.

Note that it is preferable that the oxide semiconductor film 113 be formed under a condition that a lot of oxygen is contained in the film during film formation (e.g., the oxide semiconductor film 113 is formed by a sputtering method in a 100% oxygen atmosphere), so that a film containing a lot of oxygen (preferably including a region where the oxygen content is higher than that in the stoichiometric composition of the oxide semiconductor film 113 in a crystalline state) is formed.

A target used for forming the oxide semiconductor film 113 by a sputtering method is, for example, a metal oxide target having a composition ratio of $In_2O_3:Ga_2O_3:ZnO=1:1:2$ [molar ratio], so that an In—Ga—Zn—O-based oxide film is formed. Without limitation to the material and the component of the target, for example, a metal oxide target having a composition ratio of $In_2O_3:Ga_2O_3:ZnO=1:1:1$ [molar ratio] may be used.

Further, when the oxide semiconductor film 113 is formed using the above-described metal oxide target, the composition of the target is different from that of the thin film formed over the substrate in some cases. For example, when the metal oxide target having a composition ratio of $In_2O_3:Ga_2O_3:ZnO=1:1:1$ [molar ratio] is used, the composition ratio of the oxide semiconductor film 113, which is the thin film, becomes $In_2O_3:Ga_2O_3:ZnO=1:1:0.6$ to $1:1:0.8$ [molar ratio] in some cases, though it depends on the film formation conditions. This is because in formation of the oxide semiconductor film 113, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film 113 be $In_2O_3:Ga_2O_3:ZnO=1:1:1$ [molar ratio], the composition ratio of the metal oxide target is made to be $In_2O_3:Ga_2O_3:ZnO=1:1:1.5$ [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The fill rate of the metal oxide target is 90% to 100% inclusive, preferably, 95% to 99.9% inclusive. With the use of a metal oxide target with a high fill rate, the formed oxide semiconductor film 113 can have high density.

It is preferable to use a high-purity gas from which impurities such as hydrogen, water, a hydroxyl group, or hydride are removed as a sputtering gas used when the oxide semiconductor film 113 is formed.

In order to remove the remaining moisture in the film formation chamber of a sputtering apparatus, an entrapment vacuum pump, for example, a cryopump, an ion pump, or a titanium sublimation pump is preferably used. As an exhaustion unit, a turbo molecular pump to which a cold trap is added may be used. In the film formation chamber which is evacuated with the cryopump, a hydrogen atom, a compound containing a hydrogen atom, such as water ($H_2O$), (further preferably, also a compound containing a carbon atom), and the like are evacuated, whereby the concentration of impurities contained in the oxide semiconductor film formed in the film formation chamber can be reduced.

In this embodiment, the metal oxide film 112 and the oxide semiconductor film 113 can be formed in succession without exposure to the air. When the metal oxide film 112 and the oxide semiconductor film 113 are formed successively in a vacuum without exposure to the air, impurities such as hydrogen or water can be prevented from being adsorbed onto a surface of the metal oxide film 112. Accordingly, the interface between the metal oxide film 112 and the oxide semiconductor film 113 can be kept clean.

Further, heat treatment for removal of excess hydrogen including water or a hydroxy group (dehydration or dehydrogenation) may be performed on the oxide semiconductor film 113. The temperature of the heat treatment is higher than or equal to 300° C. and lower than or equal to 700° C. or lower than the strain point of the substrate. The heat treatment can be performed under reduced pressure, a nitrogen atmosphere, or the like. For example, a substrate is introduced into an electric furnace which is one of the heat treatment apparatuses and heat treatment is performed on the oxide semiconductor film 113 at 450° C. in a nitrogen atmosphere for an hour.

Note that a heat treatment apparatus used is not limited to an electric furnace, and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

Figure 3A:
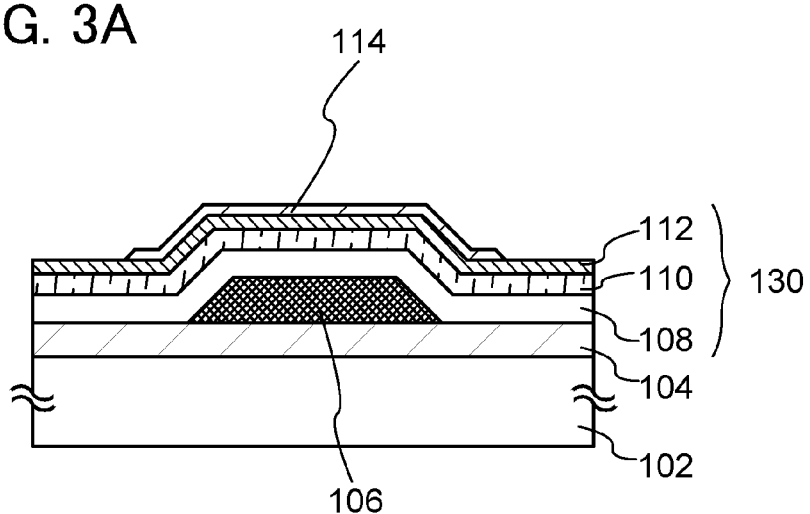
FIGS. 3A to 3C illustrate one embodiment of a method for manufacturing a semiconductor device.
Figure 3B:
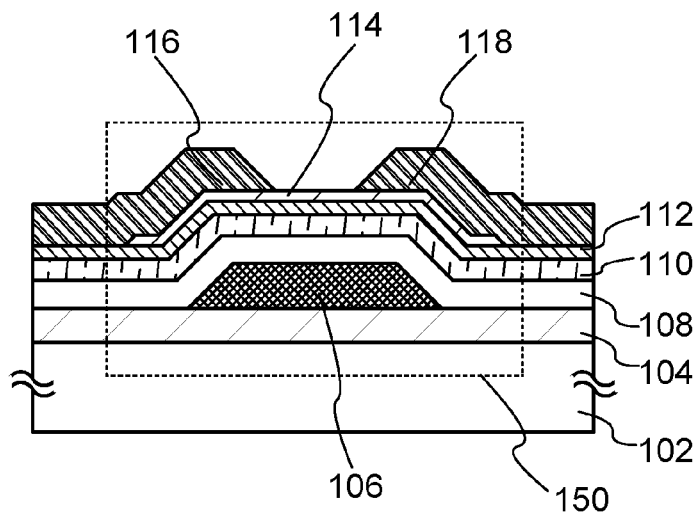

After that, a photolithography process and an etching step are performed on the oxide semiconductor film 113, so that the island-shaped oxide semiconductor film 114 is formed (see FIG. 3A). At this stage, the semiconductor device illustrated in FIG. 1A is formed.

The gate insulating film 130 includes the silicon nitride oxide film 108, the silicon oxynitride film 110, and the metal oxide film 112.

The heat treatment for dehydration or dehydrogenation may be performed at any timing as long as it is performed after the oxide semiconductor film 113 is formed, after the island-shaped oxide semiconductor film 114 is formed, or after the source electrode 116 and the drain electrode 118 which are formed later are formed.

Note that in heat treatment, it is preferable that moisture, hydrogen, and the like be not contained in nitrogen or a rare gas such as helium, neon, or argon. Further, the purity of nitrogen or the rare gas such as helium, neon, or argon which is introduced into the heat treatment apparatus is set to preferably higher than or equal to 6N (99.9999%), further preferably higher than or equal to 7N (99.99999%) (that is, the impurity concentration is preferably less than or equal to 1 ppm, further preferably less than or equal to 0.1 ppm).

In addition, after the oxide semiconductor film 114 is heated by the heat treatment, a high-purity oxygen gas, a high-purity dinitrogen monoxide gas, or ultra dry air (the moisture amount is less than or equal to 20 ppm (−55° C. by conversion into a dew point), preferably less than or equal to 1 ppm, further preferably less than or equal to 10 ppb, in the measurement with the use of a dew point meter of a cavity ring down laser spectroscopy (CRDS) system) may be introduced into the same furnace. It is preferable that water, hydrogen, or the like be not contained in the oxygen gas or the dinitrogen monoxide gas. The purity of the oxygen gas or the dinitrogen monoxide gas which is introduced into the heat treatment apparatus is preferably 6N or more, further preferably 7N or more (i.e., the impurity concentration in the oxygen gas or the dinitrogen monoxide gas is preferably less than or equal to 1 ppm, further preferably less than or equal to 0.1 ppm). The oxygen gas or the dinitrogen monoxide gas acts to supply oxygen that is a main component of the oxide semiconductor and that is reduced by removing impurities for the dehydration or dehydrogenation, so that the oxide semiconductor film 114 can be highly purified and become an i-type (intrinsic) oxide semiconductor film.

Next, a conductive film is formed over the metal oxide film 112 and the oxide semiconductor film 114. A photolithography process and an etching step are performed on the conductive film, so that the source electrode 116 and the drain electrode 118 are formed. Accordingly, the transistor 150 is formed (see FIG. 3B).

As the conductive film used for the source electrode 116 and the drain electrode 118, for example, a metal film containing an element selected from Al, Cr, Cu, Ta, Ti, Mo, and W and a metal nitride film containing any of the above elements as its component (a titanium nitride film, a molybdenum nitride film, and a tungsten nitride film) can be used. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like.

Figure 3C:
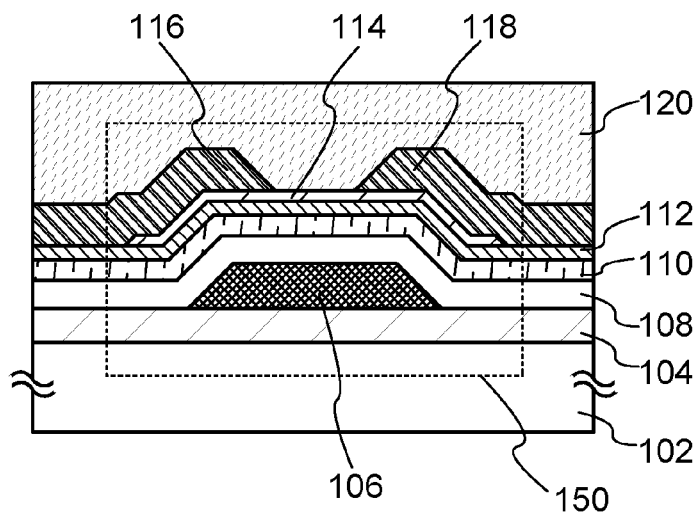

Next, the protective film 120 is formed over the oxide semiconductor film 114, the source electrode 116, and the drain electrode 118 (see FIG. 3C).

As the protective film 120, an inorganic material such as silicon oxide, silicon oxynitride, silicon nitride oxide, silicon nitride, hafnium oxide, or aluminum oxide can be used. Note that the protective film 120 may be formed by stacking a plurality of insulating films formed of any of these materials.

Specifically, a silicon oxide film or the like containing more oxygen than the stoichiometric composition is preferably used as the protective film 120. A silicon oxide film containing more oxygen than the stoichiometric composition can provide oxygen to the oxide semiconductor film 114, so that generation of oxygen vacancies in the oxide semiconductor film 114 can be prevented.

Note that a planarization insulating film may be further provided over the protective film 120 in order to decrease unevenness caused by the transistor 150. For the planarization insulating film, an organic material such as polyimide-based resin, acrylic resin, or benzocyclobutene-based resin can be used.

Through the above steps, the semiconductor device shown in FIG. 1B can be manufactured.

As described above, in the semiconductor device which includes the oxide semiconductor and is described in this embodiment, the gate insulating film is formed using a silicon nitride oxide film, a silicon oxynitride film, and a metal oxide film. Further, the interface properties are excellent because the oxide semiconductor film is in contact with the metal oxide film. Further, the metal oxide film can suppress diffusion of impurities such as water or hydrogen from the lower side to the oxide semiconductor film. Thus, a more excellent gate insulating film can be provided for the semiconductor device including the oxide semiconductor.

The metal oxide film and the oxide semiconductor film are formed successively in a vacuum without exposure to the atmosphere, so that the interface between the metal oxide film and the oxide semiconductor film can be kept clean.

This embodiment can be combined with any of the other embodiments as appropriate.

Embodiment 3

A semiconductor device having a display function (also referred to as display device) can be manufactured using the transistor described in Embodiment 1. Moreover, some or all of driver circuits which include transistors can be formed over a substrate where a pixel portion is formed, whereby a system-on-panel can be obtained.

Figure 4A:
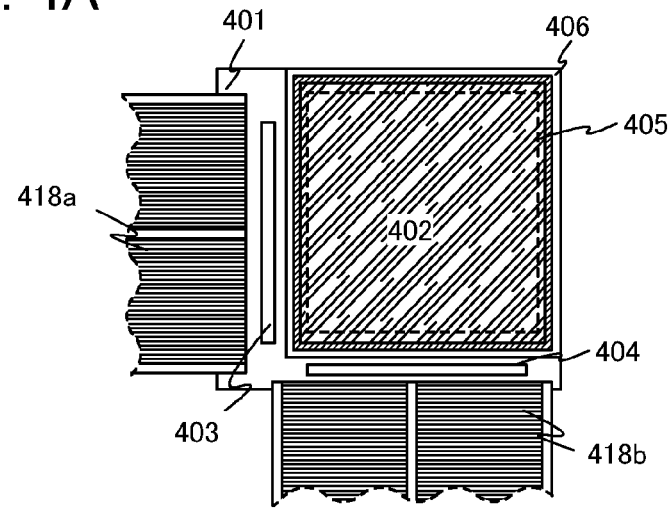
FIGS. 4A to 4C are plan views illustrating embodiments of a semiconductor device.

In FIG. 4A, a sealant 405 is provided so as to surround the pixel portion 402 provided over a first substrate 401, and the pixel portion 402 is sealed with the sealant 405 between the first substrate 401 and a second substrate 406. In FIG. 4A, a signal line driver circuit 403 and a scan line driver circuit 404 which are each formed using a single crystal semiconductor film or a polycrystalline semiconductor film over a substrate prepared separately are mounted in regions that are different from the region surrounded by the sealant 405 over the first substrate 401. Various signals and potentials are supplied to the signal line driver circuit 403, the scan line driver circuit 404, and the pixel portion 402 each of which is separately formed from flexible printed circuits (FPCs) 418a and 418b.

Figure 4B:
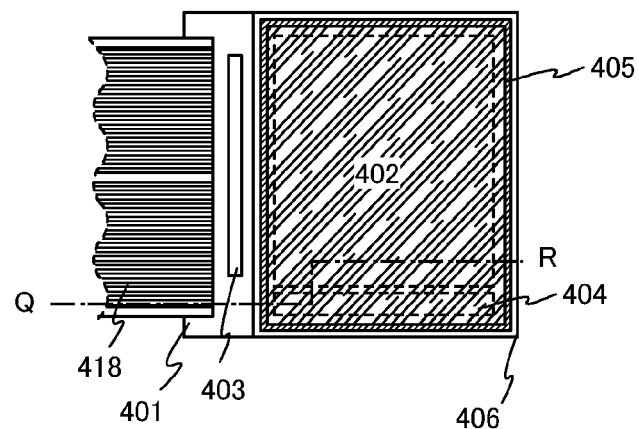
Figure 4C:
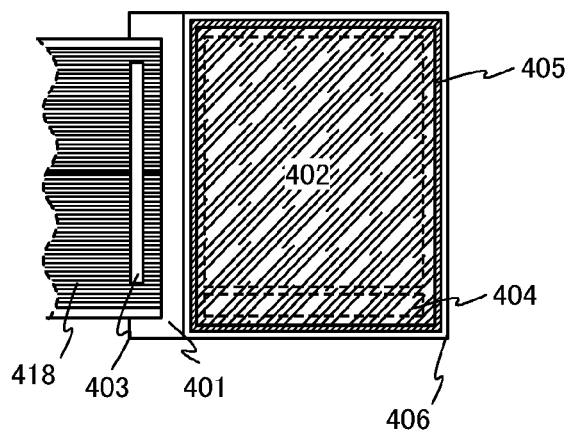

In FIGS. 4B and 4C, the sealant 405 is provided so as to surround the pixel portion 402 and the scan line driver circuit 404 which are provided over the first substrate 401. The second substrate 406 is provided over the pixel portion 402 and the scan line driver circuit 404. Consequently, the pixel portion 402 and the scan line driver circuit 404 are sealed together with a display element by the first substrate 401, the sealant 405, and the second substrate 406. In FIGS. 4B and 4C, the signal line driver circuit 403 which is formed using a single crystal semiconductor film or a polycrystalline semiconductor film over a substrate prepared separately is mounted in a region that is different from the region surrounded by the sealant 405 over the first substrate 401. In FIGS. 4B and 4C, various signals and potentials are supplied to the signal line driver circuit 403 which is separately formed, the scan line driver circuit 404, and the pixel portion 402 from an FPC 418.

Although FIGS. 4B and 4C each illustrate an example in which the signal line driver circuit 403 is formed separately and mounted on the first substrate 401, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on the method of connecting a separately formed driver circuit, and a chip on glass (COG) method, a wire bonding method, a tape automated bonding (TAB) method, or the like can be used. FIG. 4A illustrates an example in which the signal line driver circuit 403 and the scan line driver circuit 404 are mounted by a COG method. FIG. 4B illustrates an example in which the signal line driver circuit 403 is mounted by a COG method. FIG. 4C illustrates an example in which the signal line driver circuit 403 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors, and the transistor described in Embodiment 1 can be applied thereto.

As the display element provided in the display device, a liquid crystal element (also referred to as liquid crystal display element) or a light-emitting element (also referred to as light-emitting display element) can be used. The light-emitting element includes, in its category, an element whose luminance is controlled by current or voltage and specifically includes, in its category, an inorganic electroluminescent (EL) element, an organic EL element, and the like. Furthermore, a display medium whose contrast is changed by an electric effect, such as electronic ink, can be used.

Figure 5:
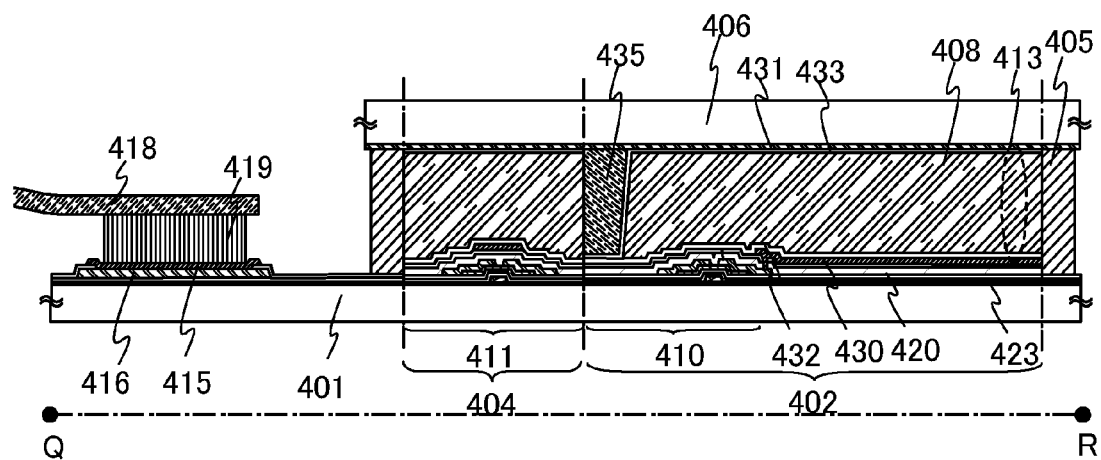
FIG. 5 is a cross-sectional view illustrating one embodiment of a semiconductor device.
Figure 6:
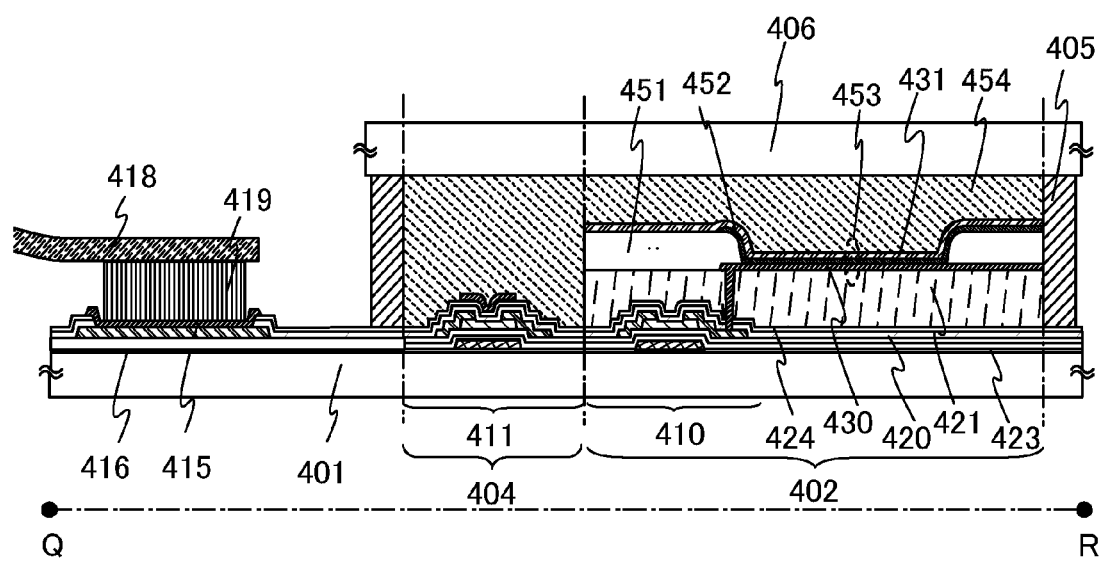
FIG. 6 is a cross-sectional view illustrating one embodiment of a semiconductor device.

Embodiments of the semiconductor device are described with reference to FIG. 5 and FIG. 6. FIG. 5 and FIG. 6 correspond to cross-sectional views along dashed line Q-R in FIG. 4B.

As illustrated in FIG. 5 and FIG. 6, the semiconductor device includes a connection terminal electrode layer 415 and a terminal electrode layer 416. The connection terminal electrode layer 415 and the terminal electrode layer 416 are electrically connected to a terminal included in the FPC 418 through an anisotropic conductive film 419.

The connection terminal electrode layer 415 is formed using the same conductive film as a first electrode layer 430, and the terminal electrode layer 416 is formed using the same conductive film as source electrode layers and drain electrode layers of transistors 410 and 411.

The pixel portion 402 and the scan line driver circuit 404 which are provided over the first substrate 401 include a plurality of transistors. In FIG. 5 and FIG. 6, the transistor 410 included in the pixel portion 402 and the transistor 411 included in the scan line driver circuit 404 are illustrated as an example. In FIG. 5, a protective film 420 is provided over the transistors 410 and 411. In FIG. 6, a protective film 424 and a protective film 421 are further provided. Note that a protective film 423 is an base insulating film functioning as a base film.

In this embodiment, the transistor described in Embodiment 1 can be applied to the transistor 410 and the transistor 411.

The transistor 410 and the transistor 411 are each a transistor including an oxide semiconductor film which is highly purified and in which formation of an oxygen vacancy is suppressed. Therefore, fluctuation in the electric characteristics of the transistor 410 and the transistor 411 is suppressed, and the transistor 410 and the transistor 411 are electrically stable.

In each of the transistors 410 and 411, the gate insulating film is formed using a silicon nitride oxide film, a silicon oxynitride film, and a metal oxide film. Further, the oxide semiconductor film is in contact with the metal oxide film, and thus has excellent interface properties. Further, the metal oxide film can suppress diffusion of impurities such as water or hydrogen from the outside into the oxide semiconductor film. Therefore, the transistors 410 and 411 have less variation in electric characteristics and are electrically stable.

Thus, when the transistors 410 and 411 are used as the semiconductor devices of this embodiment in FIG. 5 and FIG. 6, highly reliable semiconductor devices can be provided.

In addition, an example is described in this embodiment, in which a conductive layer is provided over the insulating film so as to overlap with a channel formation region of the oxide semiconductor film of the transistor 411 for the driver circuit. However, one embodiment of the present invention is not limited to this structure, and a structure in which a conductive layer is not provided may be employed. By providing the conductive layer so as to overlap with the channel formation region of the oxide semiconductor film, the amount of change in the threshold voltage of the transistor 411 by a BT test can be further reduced. The conductive layer may have the same potential as or a potential different from that of a gate electrode layer of the transistor 411, and can function as a second gate electrode layer. The potential of the conductive layer may be GND or 0 V, or the conductive layer may be in a floating state.

In addition, the conductive layer have a function of blocking an external electric field, that is, preventing an external electric field (particularly, to prevent static electricity) from affecting the inside (a circuit portion including a thin film transistor). A blocking function of the conductive layer can prevent fluctuation in the electric characteristics of the transistor due to an influence of an external electric field such as static electricity. Note that the conductive layer may be formed in a wide range of area so as to overlap with the transistor 411. Accordingly, the function of blocking static electricity is further improved.

The transistor 410 provided in the pixel portion 402 is electrically connected to a display element to form a display panel. A variety of display elements can be used as the display element as long as display can be performed.

An example of a liquid crystal display device using a liquid crystal element as a display element is illustrated in FIG. 5. In FIG. 5, a liquid crystal element 413 which is a display element includes the first electrode layer 430, a second electrode layer 431, and a liquid crystal layer 408. Insulating layers 432 and 433 functioning as alignment films are provided so that the liquid crystal layer 408 is interposed therebetween. The second electrode layer 431 is provided on the second substrate 406 side, and the first electrode layer 430 and the second electrode layer 431 are stacked with the liquid crystal layer 408 interposed therebetween.

A spacer 435 is a columnar spacer obtained by selective etching of an insulating film, and is provided in order to control the thickness (cell gap) of the liquid crystal layer 408. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral agent is mixed is used for the liquid crystal layer in order to improve the temperature range. The liquid crystal composition which includes a liquid crystal exhibiting a blue phase and a chiral agent has a short response time, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor formed using an oxide semiconductor film has a possibility that the electric characteristics of the transistor may fluctuate significantly by the influence of static electricity and deviate from the designed range. Therefore, it is more effective to use a liquid crystal material exhibiting a blue phase for the liquid crystal display device including the transistor formed using an oxide semiconductor film.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using a transistor including an oxide semiconductor film which is highly purified and in which formation of an oxygen vacancy is suppressed, it is enough to provide a storage capacitor having a capacitance that is ⅓ or less, preferably ⅕ or less of liquid crystal capacitance of each pixel.

In the transistor used in this embodiment, which includes an oxide semiconductor film which is highly purified and in which formation of an oxygen vacancy is suppressed, the current in an off state (off-state current) can be made small. Accordingly, an electric signal such as an image signal can be held for a longer period, and a writing interval can be set longer in an on state. Accordingly, frequency of refresh operation can be reduced, which leads to an effect of suppressing power consumption.

The transistor used in this embodiment, which includes an oxide semiconductor film which is highly purified and in which formation of an oxygen vacancy is suppressed, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. Some examples are given as the vertical alignment mode. For example, a multi-domain vertical alignment (MVA) mode, a patterned vertical alignment (PVA) mode, or an ASV mode can be used. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that one embodiment of the invention disclosed herein is not limited to the application to a display device for color display; one embodiment of the invention disclosed herein can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as organic EL element, and the latter is referred to as inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as current-excitation light-emitting element.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element is described here as a light-emitting element.

In order to extract light emitted from the light-emitting element, at least one of the pair of electrodes has a light-transmitting property. A transistor and a light-emitting element are formed over a substrate. The light-emitting element can have a top emission structure in which light emission is extracted through a surface opposite to the substrate; a bottom emission structure in which light emission is extracted through a surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element is illustrated in FIG. 6. A light-emitting element 453 which is a display element is electrically connected to the transistor 410 provided in the pixel portion 402. A structure of the light-emitting element 453 is not limited to the stacked-layer structure illustrated in FIG. 6, which includes the first electrode layer 430, an electroluminescent layer 452, and the second electrode layer 431. The structure of the light-emitting element 453 can be changed as appropriate depending on the direction in which light is extracted from the light-emitting element 453, or the like.

A partition wall 451 can be formed using an organic insulating material or an inorganic insulating material. It is particularly preferable that the partition wall 451 be formed using a photosensitive resin material to have an opening over the first electrode layer 430 so that a sidewall of the opening is formed as a tilted surface with continuous curvature.

The electroluminescent layer 452 may be formed using either a single layer or a plurality of layers stacked.

A protective film may be formed over the second electrode layer 431 and the partition wall 451 in order to prevent oxygen, hydrogen, water, carbon dioxide, or the like from entering the light-emitting element 453. As the protective film, a silicon nitride film, a silicon nitride oxide film, a DLC film, or the like can be formed. In addition, in a space which is formed with the first substrate 401, the second substrate 406, and the sealant 405, a filler 454 is provided for sealing. In this manner, the light-emitting element 453 and the like are preferably packaged (sealed) with a protective film (such as a laminate film or an ultraviolet curable resin film) or a cover material with high air-tightness and little degasification so that the light-emitting element 453 and the like are not exposed to the outside air.

As the filler 454, an ultraviolet curable resin or a thermosetting resin can be used as well as an inert gas such as nitrogen or argon. For example, polyvinyl chloride (PVC), an acrylic resin, polyimide-based resin, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Note that in FIG. 5 and FIG. 6, a flexible substrate as well as a glass substrate can be used as the first substrate 401 and the second substrate 406. For example, a plastic substrate having a light-transmitting property or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is interposed between PVF films or polyester films can be used.

In this embodiment, a silicon oxide film is used as the protective film 420, and an aluminum oxide film is used as the protective film 424. The protective film 420 and the protective film 424 can be formed by a sputtering method or a PE-CVD method.

The aluminum oxide film provided as the protective film 424 over the oxide semiconductor film has a high blocking effect and thus is less likely to transmit both oxygen and impurities such as hydrogen or water.

Therefore, during the manufacturing process and after the manufacture, the aluminum oxide film functions as a protective film for preventing entry of impurities such as hydrogen or water, which can cause a change, into the oxide semiconductor film and release of oxygen, which is a main component material of the oxide semiconductor, from the oxide semiconductor film.

The silicon oxide film provided as the protective film 420 in contact with the oxide semiconductor film has a function of supplying oxygen to the oxide semiconductor film. Therefore, the protective film 420 is preferably an oxide insulating film containing a lot of oxygen.

The transistor 410 and the transistor 411 each include an oxide semiconductor film which is highly purified and in which formation of an oxygen vacancy is suppressed. In addition, the transistor 410 and the transistor 411 each include a silicon nitride oxide film, a silicon oxynitride film, and a metal oxide film as a gate insulating film. With such a structure of the gate insulating film, the transistors 410 and 411 have less variation in electric characteristics and are electrically stable.

Further, the protective film 421 functioning as a planarization insulating film can be formed using an organic material having heat resistance, such as an acrylic resin, polyimide-based resin, a benzocyclobutene-based resin, polyamide-based resin, or an epoxy resin. Alternatively, the protective film 421 may be formed by stacking a plurality of insulating films formed using any of these materials.

There is no particular limitation on the method of forming the protective film 421, and the following method or tool (equipment) can be used depending on the material: a sputtering method, an SOG method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Therefore, the substrate and the thin films such as the insulating film and the conductive film provided for the pixel portion where light is transmitted have light-transmitting properties with respect to light in the visible light wavelength range.

The first electrode layer and the second electrode layer (each of which may be called pixel electrode layer, common electrode layer, counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 430 and the second electrode layer 431 can be formed using a light-transmitting conductive material such as indium oxide containing tungsten oxide, indium zinc oxide containing tungsten oxide, indium oxide containing titanium oxide, indium tin oxide containing titanium oxide, ITO, indium zinc oxide, indium tin oxide to which silicon oxide is added, or graphene.

The first electrode layer 430 and the second electrode layer 431 can be formed using one or plural kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as conductive polymer) can be used for the first electrode layer 430 and the second electrode layer 431. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protection circuit for protecting the driver circuit is preferably provided. The protection circuit is preferably formed using a nonlinear element.

By using the transistor described in Embodiment 1 as described above, the semiconductor device can have a variety of functions.

Embodiment 4

A semiconductor device disclosed in this specification can be applied to a variety of electronic appliances (including game machines). Examples of electronic appliances are a television set (also referred to as television or television receiver), a monitor of a computer or the like, a camera such as a digital camera or a digital video camera, a digital photo frame, a mobile phone (also referred to as cellular phone or cellular phone device), a portable game machine, a personal digital assistant, an audio reproducing device, and a large-sized game machine such as a pachinko machine. Examples of electronic appliances each including the semiconductor device described in any of the above embodiments are described with reference to FIGS. 7A to 7F.

Figure 7A:
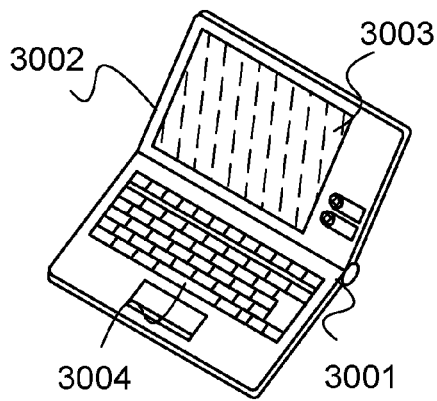
FIGS. 7A to 7F each illustrate an electronic device.

FIG. 7A illustrates a laptop personal computer including a main body 3001, a housing 3002, a display portion 3003, a keyboard 3004, and the like. The semiconductor device described in any of the above embodiments is applied to the display portion 3003, whereby a highly reliable laptop personal computer can be provided.

Figure 7B:
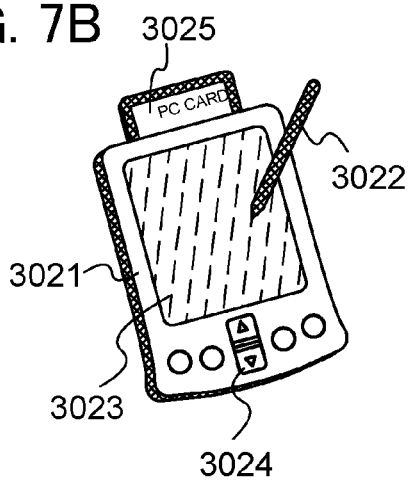

FIG. 7B is a personal digital assistant (PDA) including a display portion 3023, an external interface 3025, an operation button 3024, and the like in a main body 3021. A stylus 3022 is provided as an accessory for operation. The semiconductor device described in any of the above embodiments is applied to the display portion 3023, whereby a highly reliable personal digital assistant (PDA) can be provided.

Figure 7C:
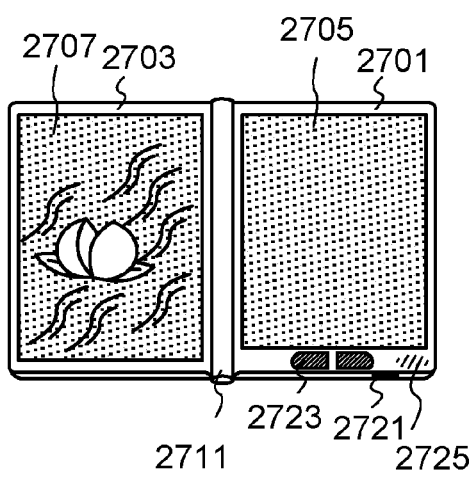

FIG. 7C illustrates an example of an e-book reader. For example, the e-book reader includes two housings, a housing 2701 and a housing 2703. The housing 2701 and the housing 2703 are combined with a hinge 2711 so that the e-book reader can be opened and closed with the hinge 2711 as an axis. With such a structure, the e-book reader can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 7C) can display text and a display portion on the left side (the display portion 2707 in FIG. 7C) can display graphics. The semiconductor device described in any of the above embodiments is applied to the display portion 2705 and the display portion 2707, whereby a highly reliable e-book reader can be provided. In the case of using a transflective or reflective liquid crystal display device as the display portion 2705, the e-book reader may be used in a comparatively bright environment; therefore, a solar cell may be provided so that power generation by the solar cell and charge by a battery can be performed. When a lithium ion battery is used as the battery, there are advantages of downsizing and the like.

FIG. 7C illustrates an example in which the housing 2701 includes an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (such as an earphone terminal or a USB terminal), a recording medium insertion portion, and the like may be provided on the back surface or the side surface of the housing. Moreover, the e-book reader may have a function of an electronic dictionary.

The e-book reader may have a configuration capable of wirelessly transmitting and receiving data. Through wireless communication, desired book data or the like can be purchased and downloaded from an e-book server.

Figure 7D:
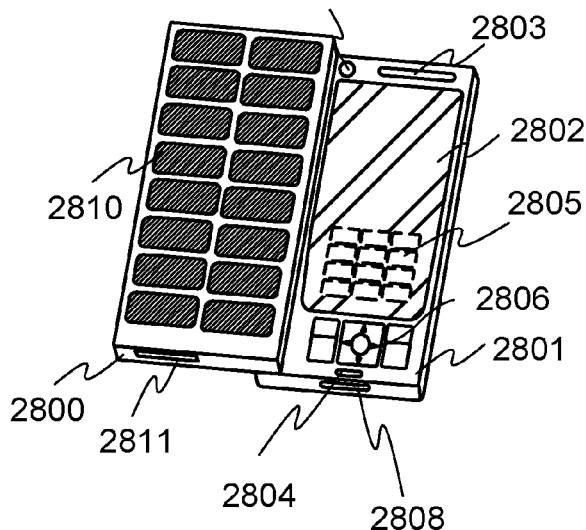

FIG. 7D illustrates a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. An antenna is incorporated in the housing 2801. The semiconductor device described in any of the above embodiments is applied to the display panel 2802, whereby a highly reliable mobile phone can be provided.

Further, the display panel 2802 includes a touch panel. A plurality of operation keys 2805 displayed as images is illustrated by dashed lines in FIG. 7D. Note that a boosting circuit by which voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like as well as voice calls. Furthermore, the housings 2800 and 2801 which are developed as illustrated in FIG. 7D can overlap with each other by sliding; thus, the size of the mobile phone can be reduced, which makes the mobile phone suitable for being carried.

The external connection terminal 2808 can be connected to an AC adapter and various types of cables such as a USB cable, and charge and data communication with a personal computer or the like are possible. Moreover, a large amount of data can be stored by inserting a memory medium into the external memory slot 2811 and can be moved.

Further, in addition to the above functions, an infrared communication function, a television reception function, or the like may be provided.

Figure 7E:
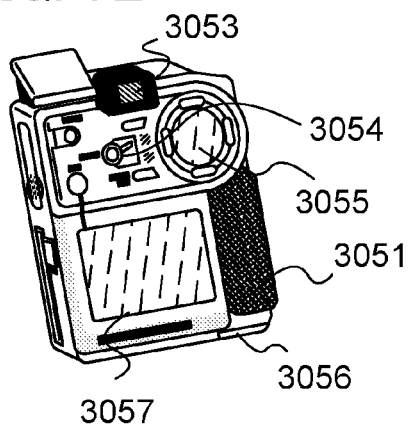

FIG. 7E illustrates a digital video camera including a main body 3051, a display portion A 3057, an eyepiece 3053, an operation switch 3054, a display portion B 3055, a battery 3056, and the like. The semiconductor device described in any of the above embodiments is applied to the display portion A 3057 and the display portion B 3055, whereby a highly reliable digital video camera can be provided.

Figure 7F:
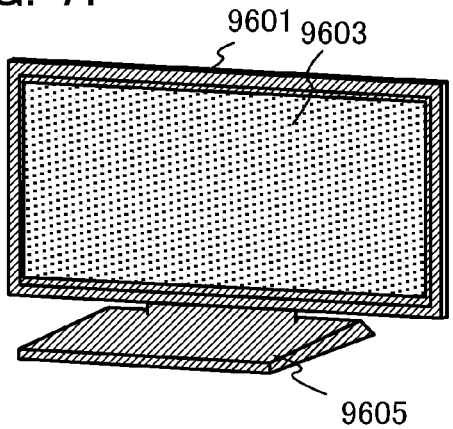

FIG. 7F illustrates an example of a television set. In the television set, a display portion 9603 is incorporated in a housing 9601. The display portion 9603 can display images. Here, the housing 9601 is supported by a stand 9605. The semiconductor device described in any of the above embodiments is applied to the display portion 9603, whereby a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) data communication can be performed.

This embodiment can be implemented in appropriate combination with any of the structures described in the other embodiments.

Example 1

In this example, as an example of a metal oxide film which was able to be used for one embodiment of the present invention, an aluminum oxide film was evaluated. Description is given with reference to FIGS. 8A and 8B, FIG. 9, FIGS. 10A and 10B, FIGS. 11A and 11B, FIGS. 12A and 12B, and FIGS. 13A and 13B. As the evaluation methods, X-ray reflectometry (XRR), secondary ion mass spectrometry (SIMS), and thermal desorption spectrometry (TDS) were used.

Figure 8A:
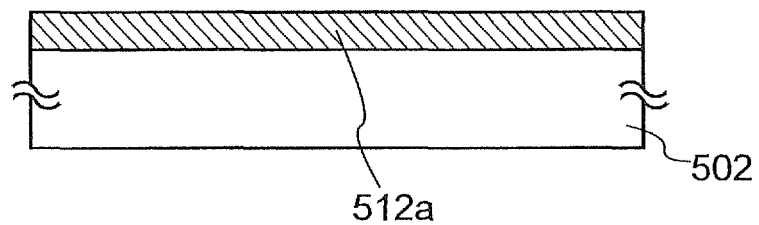
FIGS. 8A and 8B each illustrate an example of a metal oxide film in Example 1.
Figure 8B:
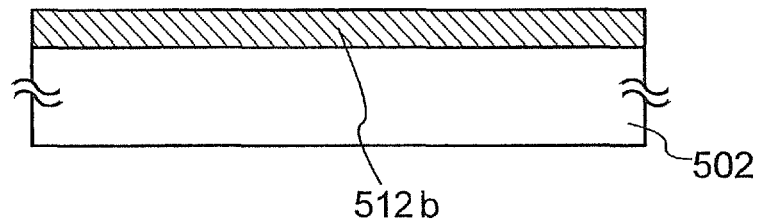

First, evaluation results of XRR are shown. FIGS. 8A and 8B each illustrate a structure of a sample used for the XRR.

The sample illustrated in FIG. 8A was obtained by forming a metal oxide film 512a over a glass substrate 502. The sample illustrated in FIG. 8B was obtained by forming a metal oxide film 512b over the glass substrate 502.

As the metal oxide film 512a, an aluminum oxide film was formed with a sputtering apparatus. The formation conditions of the metal oxide film 512a were as follows: the substrate temperature was room temperature; $O_2$=50 sccm ($O_2$=100%); the power was 6 kW (pulsed DC power source, pulse=300 kHz); and the pressure was 0.6 Pa. Note that the film thickness was 100 nm. An aluminum target was used as a sputtering target.

As the metal oxide film 512b, an aluminum oxide film was formed with a sputtering apparatus. The formation conditions of the metal oxide film 512b were as follows: the substrate temperature was 150° C.; $O_2$=300 sccm ($O_2$=100%); the power was 30 kW (AC power source); and the pressure was 0.7 Pa. Note that the film thickness was 100 nm. An aluminum target was used as a sputtering target.

The samples having the structures illustrated in FIGS. 8A and 8B are referred to as Samples 1 and 2, respectively. The film density of the aluminum oxide films of the samples was evaluated by the XRR. In the XRR, each of the samples was measured at three points. Further, the film density was evaluated on the assumption that the composition of the aluminum oxide film was an ideal composition: $Al_2O_3$ (Z/A=0.4882, (Z=atomic number, A=mass number)).

Figure 9:
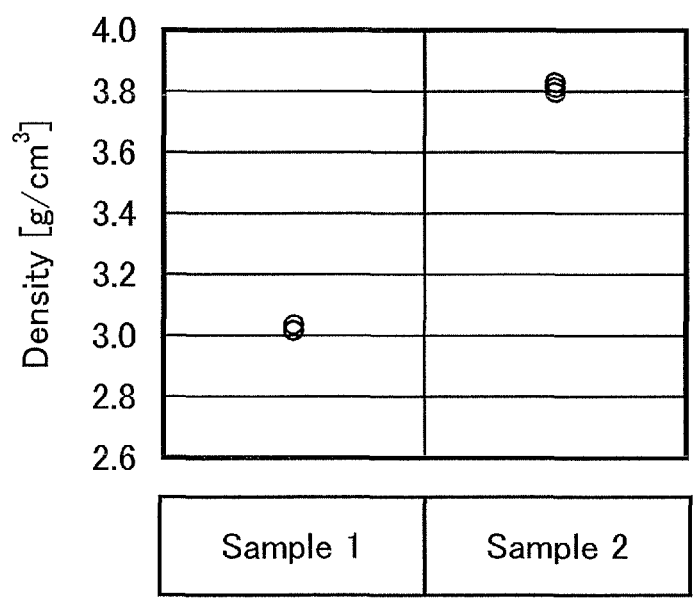
FIG. 9 shows measurement results of densities of aluminum oxide films.

FIG. 9 shows the measurement results. As shown in FIG. 9, the film density of the aluminum oxide film of Sample 1 was approximately 3.0 g/cm$^3$, and the film density of the aluminum oxide film of Sample 2 was approximately 3.8 g/cm$^3$.

Figure 10A:
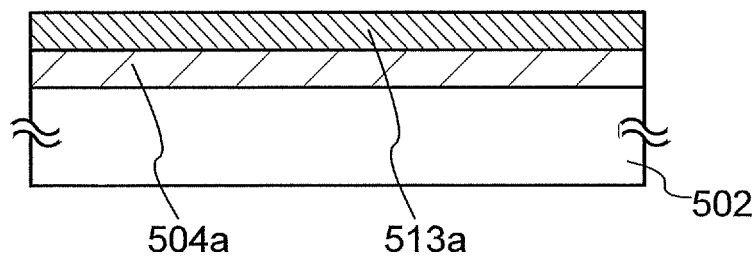
FIGS. 10A and 10B each illustrate an example of a metal oxide film in Example 1.
Figure 10B:
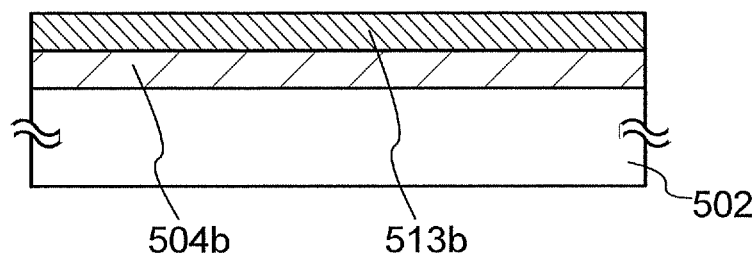

Next, evaluation by SIMS analysis is described. FIGS. 10A and 10B each illustrate a structure of a sample used for the SIMS analysis.

The sample for evaluation illustrated in FIG. 10A was obtained by forming a silicon oxide film 504a over the glass substrate 502 and forming a metal oxide film 513a over the silicon oxide film 504a. The sample for evaluation illustrated in FIG. 10B was obtained by forming a silicon oxide film 504b over the glass substrate 502 and forming a metal oxide film 513b over the silicon oxide film 504b. Note that the samples having the structures illustrated in FIGS. 10A and 10B are referred to as Samples 3 and 4, respectively.

The formation conditions of the silicon oxide film 504a were as follows: a sputtering method is used; the substrate temperature was 200° C.; $O_2$=300 sccm ($O_2$=100%); the power was 6 kW (pulsed DC power source, pulse=300 kHz); and the pressure was 0.4 Pa. Note that the film thickness was 100 nm.

The formation conditions of the silicon oxide film 504b were as follows: a sputtering method is used; the substrate temperature was 200° C.; $O_2$=300 sccm ($O_2$=100%); the power was 6 kW (pulsed DC power source, pulse=300 kHz); and the pressure was 0.4 Pa. Note that the film thickness was 400 nm.

As the metal oxide film 513a, an aluminum oxide film was formed with a sputtering apparatus. The formation conditions of the metal oxide film 513a were as follows: the substrate temperature was room temperature; $O_2$=50 sccm ($O_2$=100%); the power was 6 kW (pulsed DC power source, pulse=300 kHz); and the pressure was 0.6 Pa. Note that the film thickness was 50 nm. An aluminum target was used as a sputtering target.

As the metal oxide film 513b, an aluminum oxide film was formed with a sputtering apparatus. The formation conditions of the metal oxide film 513b were as follows: the substrate temperature was 150° C.; $O_2$=300 sccm ($O_2$=100%); the power was 30 kW (AC power source); and the pressure was 0.7 Pa. Note that the film thickness was 100 nm. An aluminum target was used as a sputtering target.

Note that the film density of the aluminum oxide film of the metal oxide film 513a was 3.0 g/cm$^3$, and the film density of the aluminum oxide film of the metal oxide film 513b was 3.8 g/cm$^3$.

The structures of Samples 3 and 4 described above are shown in Table 1.

TABLE 1

| Structure | | Film density of aluminum oxide film [g/cm$^3$] |
|---|---|---|
| Sample 3 | glass\silicon oxide (100 nm)\aluminum oxide (50 nm) | 3.0 |
| Sample 4 | glass\silicon oxide (400 nm)\aluminum oxide (100 nm) | 3.8 |

A pressure cooker test (PCT) was performed on Samples 3 and 4 shown in Table 1. In the PCT in this example, Samples 3 and 4 were held for 100 hours under the following conditions: the temperature was 130° C.; the humidity was 85%; the atmosphere was water ($H_2O$):deuterated water ($D_2O$)=3:1 [volume ratio]; and the pressure was 2.3 atm (0.23 MPa).

SIMS analysis was performed on Samples 3 and 4 after the PCT in order to measure the concentrations of hydrogen (H) atoms and deuterium (D) atoms in the films. The measurement results of Samples 3 and 4 are shown in FIGS. 11A and 11B, respectively.

It is known that it is difficult to obtain accurate data in the proximity of a surface of a sample or in the proximity of an interface between stacked films formed using different materials by the SIMS analysis in measurement principle. Thus, in the case where distributions of the concentrations of hydrogen (H) atoms and deuterium (D) atoms in the film in the thickness direction are analyzed by SIMS, an average value in a region where the film is provided, the value is not greatly changed, and an almost constant level of strength can be obtained is employed as the concentrations of hydrogen (H) atoms and deuterium (D) atoms.

Figure 11B:
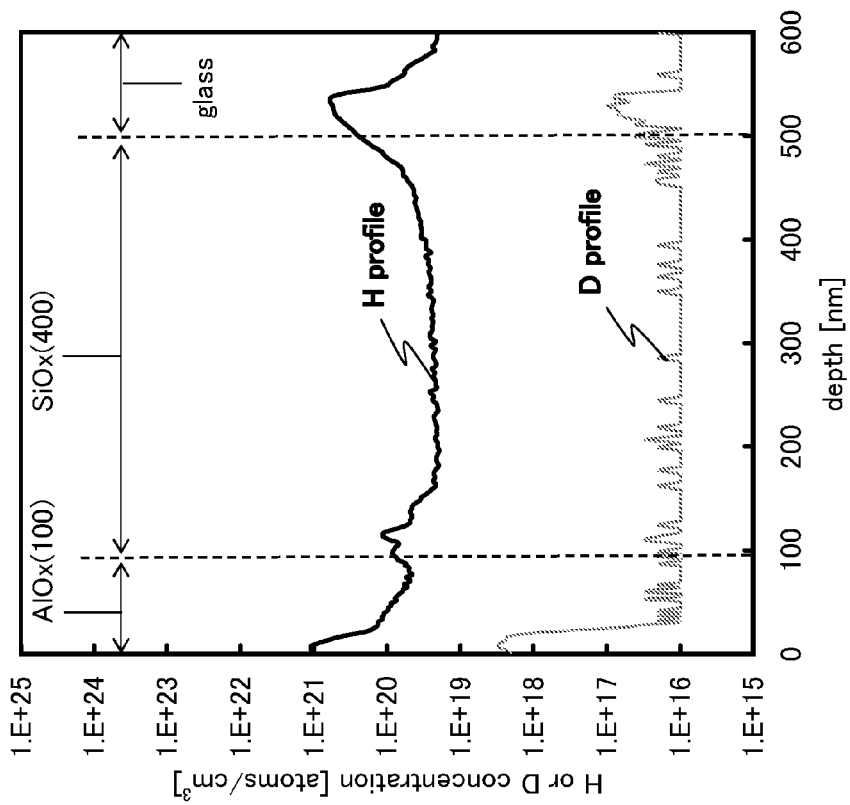
FIGS. 11A and 11B each show results of SIMS analysis.
Figure 11A:
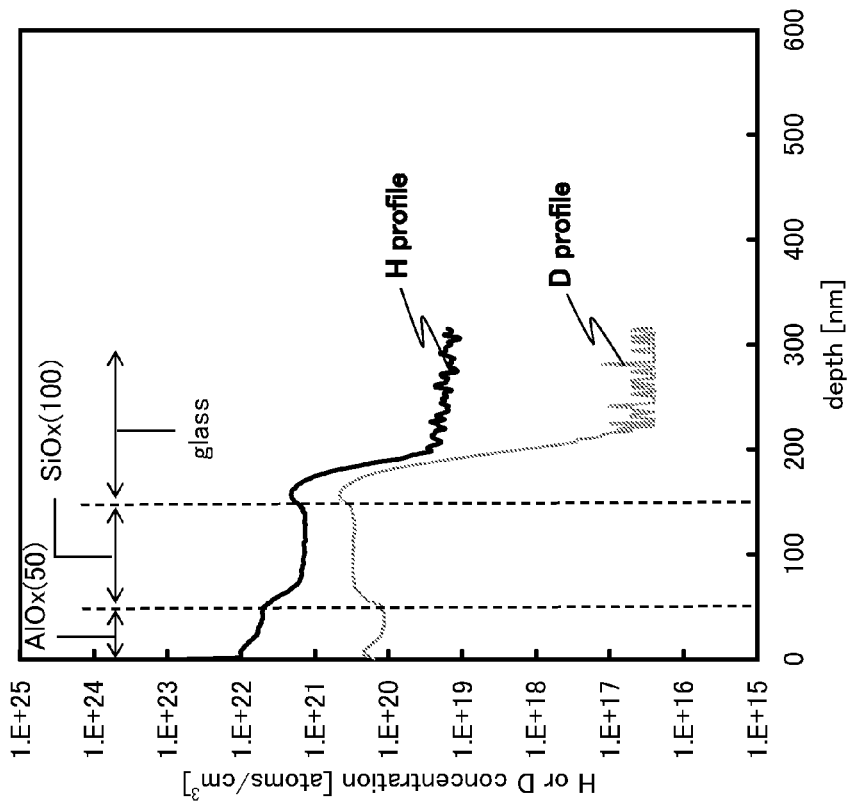

FIG. 11A shows that the concentrations of hydrogen (H) atoms and deuterium (D) atoms in the silicon oxide film 504a of Sample 3 are $1.4 \times 10^{21}$ atoms/cm$^3$ and $2.9 \times 10^{20}$ atoms/cm$^3$, respectively.

FIG. 11B shows that the concentration of hydrogen (H) atoms in the silicon oxide film 504b of Sample 4 is $2.2 \times 10^{19}$ atoms/cm$^3$ and the concentration of deuterium (D) atoms in the silicon oxide film 504b of Sample 4 is lower than or equal to a lower limit of detection. Note that the lower limit of detection of the concentration of deuterium (D) atoms by SIMS analysis in this example is $1.0 \times 10^{16}$ atoms/cm$^3$.

Note that all the results of SIMS analysis in this example were quantified using a standard sample of a silicon oxide film.

FIGS. 11A and 11B show that in Sample 3 which includes the aluminum oxide film having a film density of approximately 3.0 g/cm$^3$, hydrogen (H) atoms and deuterium (D) atoms pass through the aluminum oxide film and are diffused into the silicon oxide film. On the other hand, in Sample 4 which includes the aluminum oxide film having a film density of approximately 3.8 g/cm$^3$, diffusion of hydrogen (H) atoms and deuterium (D) atoms is suppressed in the aluminum oxide film. In hydrogen (H) atoms and deuterium (D) atoms, the concentrations are drastically decreased in the aluminum oxide film at a depth of around 30 nm; thus, it can be said that the diffusion of hydrogen (H) atoms and deuterium (D) atoms can be suppressed even when the thickness of the aluminum oxide film is 50 nm, as in Sample 3.

As described above, it is founded that barrier properties of the aluminum oxide film to hydrogen (H) atoms and deuterium (D) atoms of the aluminum oxide film are varied depending on the film density of the aluminum oxide film.

Figure 12A:
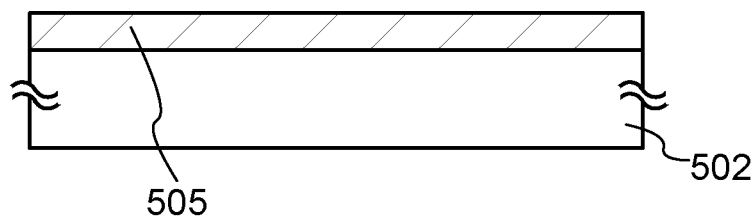
FIGS. 12A and 12B each illustrate an example of a metal oxide film in Example 1.
Figure 12B:
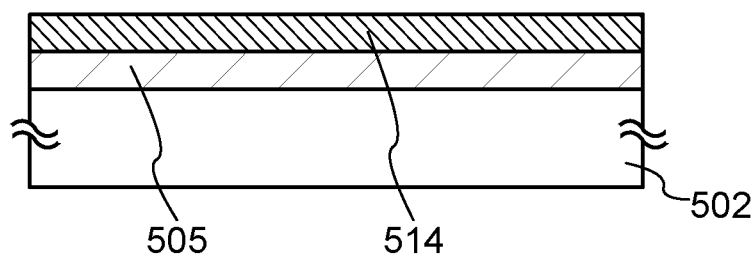

Next, evaluation by TDS analysis is described. FIGS. 12A and 12B each illustrate a structure of a sample used for the TDS analysis.

The sample illustrated in FIG. 12A was obtained by forming a silicon nitride film 505 over the glass substrate 502. The sample illustrated in FIG. 12B was obtained by forming the silicon nitride film 505 over the glass substrate 502 and forming an aluminum oxide film over the silicon nitride film 505 as a metal oxide film 514.

The formation conditions of the silicon nitride film 505 were as follows: a PE-CVD apparatus was used; the substrate temperature was 220° C., and $SiH_4$=270 sccm, $H_2$=4000 sccm, and $N_2O$=2700 sccm. Note that the film thickness was 100 nm.

For the metal oxide film 514, an aluminum oxide film was formed with a sputtering apparatus. The formation conditions of the aluminum oxide film were as follows: the substrate temperature was 150° C.; $O_2$=100 sccm ($O_2$=100%); the power was 30 kW (AC power source); and the pressure was 0.7 Pa. Note that the film thickness was 100 nm.

Figure 13A:
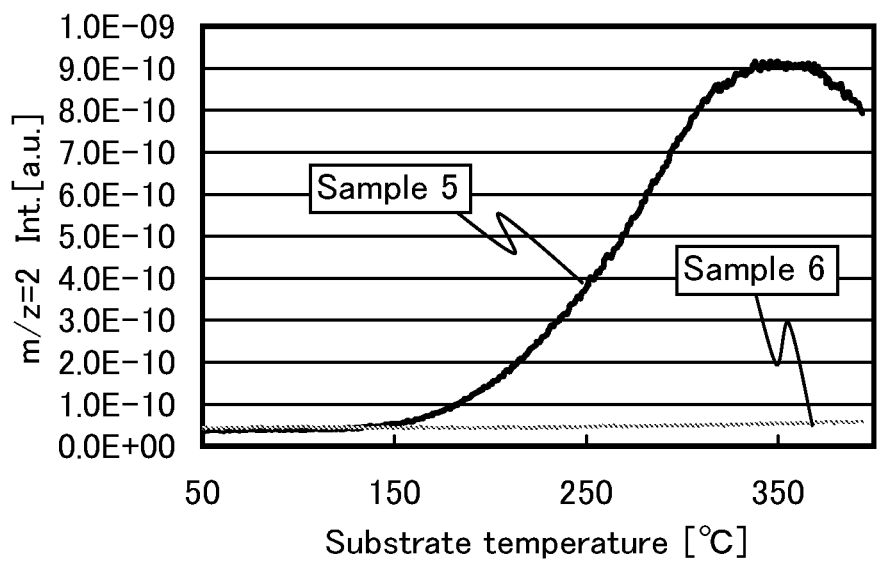
FIGS. 13A and 13B each show results of TDS analysis.
Figure 13B:
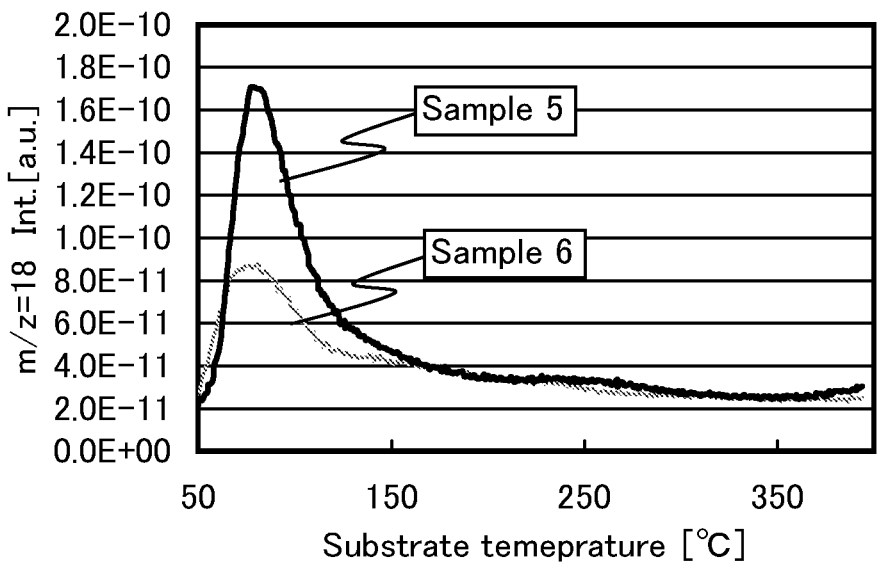

Note that the samples having the structures illustrated in FIGS. 12A and 12B are referred to as Samples 5 and 6, respectively, and TDS analysis was performed on Samples 5 and 6. Note that TDS analysis is an analysis method in which each of the samples is heated in a vacuum case and a gas component generated from each of the samples when the temperature of each of the samples is increased is detected by a quadrupole mass spectrometer. Detected gas components are distinguished from each other by the ion intensity of m/z (mass/charge). Note that in this example, a component having an ion intensity of m/z=2 was identified as hydrogen ($H_2$) and a component having an ion intensity of m/z=18 was water ($H_2O$). FIG. 13A shows TDS spectra of the samples when m/z=2 ($H_2$), and FIG. 13B shows TDS spectra of the samples when m/z=18 ($H_2O$). In FIG. 13A, the horizontal axis represents the substrate temperature (° C.) and the vertical axis represents the ion intensity of m/z=2 (arbitrary unit). In FIG. 13B, the horizontal axis represents the substrate temperature (° C.) and the vertical axis represents the ion intensity of m/z=18 (arbitrary unit).

FIG. 13A shows that Sample 5 has a peak at around 350° C. and hydrogen ($H_2$) is detected. The detected hydrogen is regarded as $H_2$ contained in the silicon nitride film 505. On the other hand, the detection distribution of Sample 6 is substantially flat in the measurement range, and hydrogen ($H_2$) is not prominently detected. The reason why hydrogen ($H_2$) is not prominently detected in Sample 6 is because the metal oxide film 514 suppresses diffusion of $H_2$ contained in the silicon nitride film 505 to the outside.

FIG. 13B shows that Samples 5 and 6 each have a peak of $H_2O$ at around 50° C. to 100° C., and this peak occurs because of absorbed moisture on a surface of the sample. When Sample 5 is compared with Sample 6, the amount of detected $H_2O$ in Sample 6 is smaller than that in Sample 5. It is indicated that there is a possibility that the amount of absorbed moisture on the surface of the sample is reduced when the metal oxide film 514 is an outermost surface.

As described above, a metal oxide film is formed over a silicon nitride film, so that even when water, hydrogen, or the like is contained in the silicon nitride film, diffusion thereof can be suppressed by the metal oxide film.

Example 2

In this example, electric characteristics of a transistor obtained by a method for manufacturing a semiconductor device of one embodiment of the present invention are described.

Figure 14A:
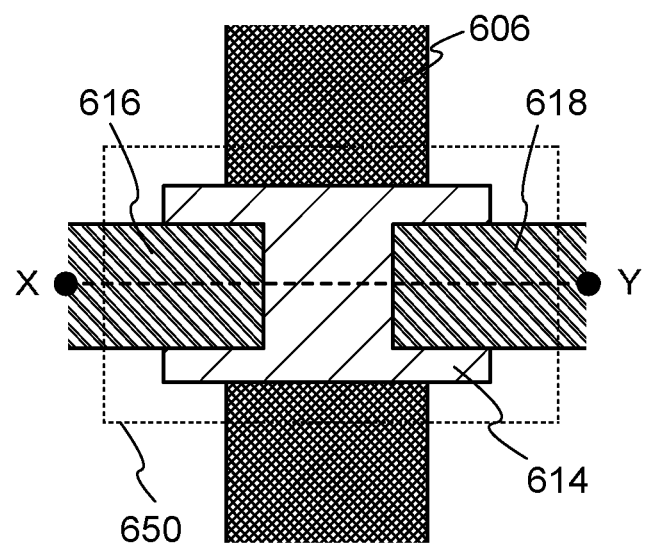
FIGS. 14A and 14B are a plan view and a cross-sectional view illustrating a transistor according to one embodiment of the present invention.
Figure 14B:
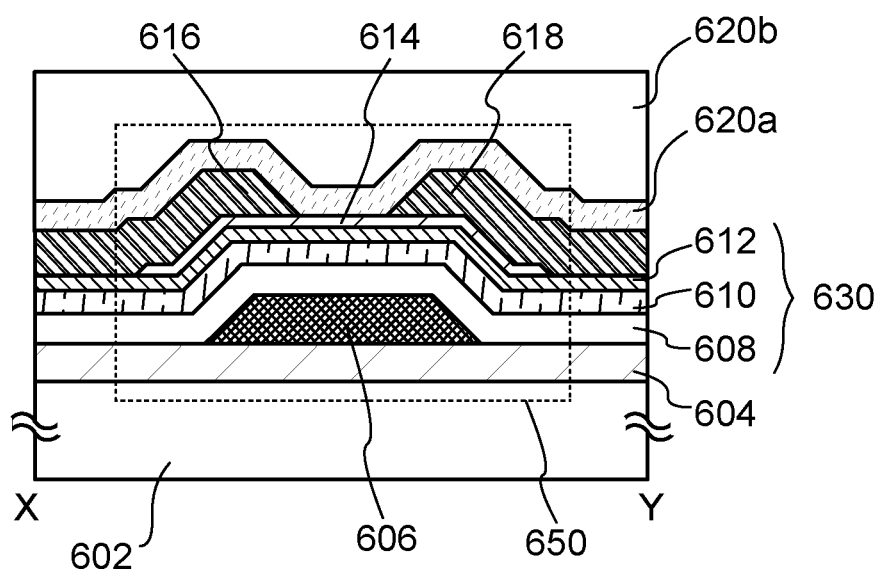

The structure of a transistor in this example is described with reference to FIGS. 14A and 14B. Note that FIG. 14A illustrates a plan view of the transistor, and FIG. 14B is a cross-sectional view corresponding to a dashed line X-Y shown in FIG. 14A. Further, in FIG. 14A, some components (e.g., a gate insulating film, a protective film, and the like) are omitted in order to avoid complexity of the drawing.

A transistor 650 illustrated in FIGS. 14A and 14B includes a substrate 602, a base insulating film 604, a gate electrode 606, a silicon nitride oxide film 608, a silicon oxynitride film 610, a metal oxide film 612, an oxide semiconductor film 614, a source electrode 616, and a drain electrode 618. Further, a protective film 620a and a protective film 620b are formed to cover the transistor 650.

Further, a gate insulating film 630 includes the silicon nitride oxide film 608, the silicon oxynitride film 610, and the metal oxide film 612.

A method for manufacturing the transistor 650 is described below with reference to FIG. 14B.

A 0.7-mm-thick glass substrate was used as the substrate 602, and the base insulating film 604 was formed over the substrate 602. The base insulating film 604 has a stacked-layer structure in which a 150-nm-thick silicon oxide film is formed over a 100-nm-thick silicon nitride film.

Next, a conductive film was formed over the base insulating film 604, and a photolithography process and an etching step were performed, so that the gate electrode 606 was formed. As the gate electrode 606, a 100-nm-thick tungsten film was formed with a sputtering apparatus.

Next, the silicon nitride oxide film 608 and the silicon oxynitride film 610 were formed over the base insulating film 604 and the gate electrode 606. The silicon nitride oxide film 608 and the silicon oxynitride film 610 were formed successively in a vacuum with a PE-CVD apparatus. The formation conditions of the silicon nitride oxide film 608 were as follows: $SiH_4$=270 sccm, $NH_3$=2700 sccm, $N_2$=4000 sccm, and $N_2O$=500 sccm; the pressure was 200 Pa; the substrate temperature was 300° C.; the power was 2 kW (RF power source (frequency: 27 MHz)); and the distance between the electrode and the substrate was 15 nm. Note that the film thickness was 325 nm. The formation conditions of the silicon oxynitride film 610 were as follows: $SiH_4$=90 sccm and $N_2O$=9000 sccm; the pressure was 80 Pa; the substrate temperature was 300° C.; the power was 1 kW (RF power source (frequency: 27 MHz)); and the distance between the electrode and the substrate was 15 nm. Note that the film thickness was 50 nm.

Next, first heat treatment was performed at 350° C. under a nitrogen atmosphere for an hour using a baking furnace.

Next, the metal oxide film 612 and an oxide semiconductor film were formed over the silicon oxynitride film 610 successively in a vacuum.

For the metal oxide film 612, an aluminum oxide film was formed with a sputtering apparatus. The formation conditions of the metal oxide film 612 were as follows: the substrate temperature was 150° C.; $O_2$=300 sccm ($O_2$=100%); the power was 30 kW (AC power source); and the pressure was 0.7 Pa. Note that the film thickness was 50 nm. An aluminum target was used as a sputtering target.

Note that the metal oxide film 612 is similar to the aluminum oxide film of Sample 4 described in Example 1 and has a film density of 3.8 g/cm$^3$.

Further, the oxide semiconductor film was formed under the following conditions: an IGZO target ($In_2O_3$:$Ga_2O_3$:ZnO=1:1:2 [molar ratio]) was used; the substrate temperature was 170° C.; the pressure was 0.6 Pa; and the power was 5 kW (AC power source). The thickness of the oxide semiconductor film was 35 nm.

Next, the oxide semiconductor film was processed by a photolithography process and an etching step, so that the oxide semiconductor film 614 was formed.

Next, second heat treatment was performed at 350° C. under a nitrogen atmosphere for an hour using a baking furnace; then, third heat treatment was performed at 350° C. under a nitrogen and oxygen atmosphere for an hour using the baking furnace.

Next, a conductive film was formed over the metal oxide film 612 and the oxide semiconductor film 614, and a photolithography process and an etching step were performed, so that the source electrode 616 and the drain electrode 618 were formed. The source electrode 616 and the drain electrode 618 each have a three-layer structure of a 100-nm-thick titanium film, a 400-nm-thick aluminum film, and a 100-nm-thick titanium film.

Next, fourth heat treatment was performed at 300° C. under a nitrogen atmosphere for an hour using a baking furnace; then, the protective film 620a was formed. As the protective film 620a, a silicon oxide film was formed with a sputtering apparatus. The formation conditions of the silicon oxide film were as follows: a Si target was used; the substrate temperature was room temperature; $O_2$=300 sccm; and the pressure was 0.7 Pa. Note that the film thickness was 400 nm.

Next, the protective film 620b was formed over the protective film 620a. For the protective film 620b, an acrylic resin was formed by a spin coating method. The thickness was 1.5 μm.

After that, fifth heat treatment was performed at 250° C. under a nitrogen atmosphere for an hour using a baking furnace.

Through the above-described steps, the transistor 650 was formed. Note that the transistor 650 of this example was formed to have a channel length (L) of 3 μm and a channel width (W) of 3 μm.

An electric measurement was performed on the transistor 650 of one embodiment of the present invention, which was obtained through the above-described steps. The results of the electric measurement of the transistor 650 are shown in FIG. 15.

Figure 15:
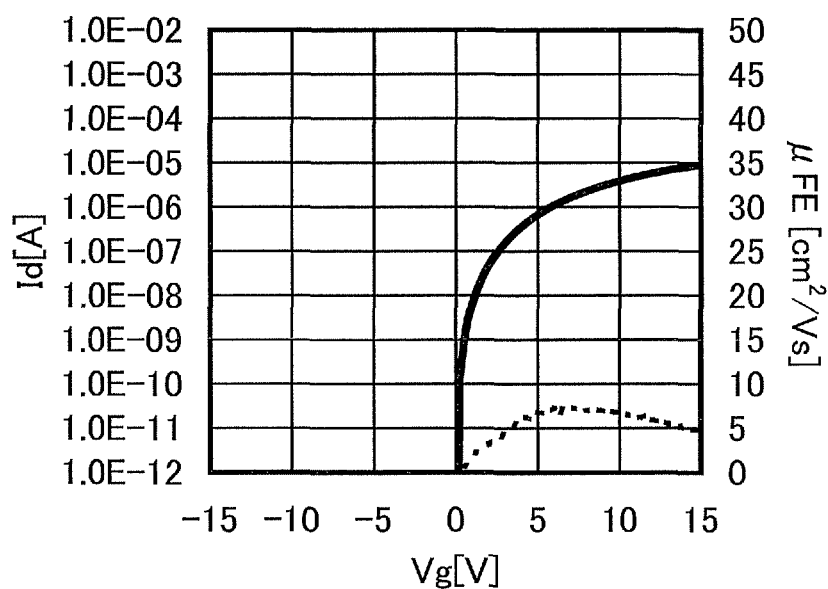
FIG. 15 shows measurement results of electrical characteristics of a transistor according to one embodiment of the present invention.

In the results of the electric measurement shown in FIG. 15, a solid line indicates a drain current ($I_d$)-gate voltage ($V_g$) characteristics obtained by changing a gate voltage ($V_g$) from −15 V to 15 V by 0.25 V when a voltage ($V_d$) between a source electrode and a drain electrode of a transistor is 10 V. A dashed line indicates field effect mobility (μFE) obtained by changing a gate voltage ($V_g$) from −15 V to 15 V by 0.25 V when the voltage ($V_d$) between the source electrode and the drain electrode of a transistor is 10 V.

FIG. 15 shows that the maximum field effect mobility (μFE) of the transistor 650 of this example in a saturation region is 7.5 cm$^2$/Vs in the case where the voltage ($V_d$) between the source electrode and the drain electrode is 10 V and the gate voltage ($V_g$) is changed from −15 V to 15 V. Further, the transistor is confirmed to be normally off when $V_g$=0 V.

As described above, the transistor 650 in this example is a normally-off transistor having a high mobility.

This example can be implemented in combination with any of the other embodiments and the other example as appropriate.

This application is based on Japanese Patent Application serial No. 2011-179660 filed with Japan Patent Office on Aug. 19, 2011, the entire contents of which are hereby incorporated by reference.

What is claimed is:
1. A semiconductor device comprising:
 a gate electrode;
 a gate insulating film comprising a silicon nitride oxide film over the gate electrode, a silicon oxynitride film over the silicon nitride oxide film, and a metal oxide film over the silicon oxynitride film;
 an oxide semiconductor film over and in contact with the metal oxide film;
 a source electrode and a drain electrode over the oxide semiconductor film; and
 a protective film over and in contact with the oxide semiconductor film, the source electrode, and the drain electrode,
 wherein the oxide semiconductor film comprises a c-axis aligned crystalline oxide semiconductor,
 wherein the oxide semiconductor film is an In—Ga—Zn-based oxide film, and
 wherein the metal oxide film is a Ga—Zn-based oxide film.
2. The semiconductor device according to claim 1, wherein the silicon nitride oxide film has a larger thickness than the silicon oxynitride film.

3. The semiconductor device according to claim 1, wherein the metal oxide film has a smaller thickness than the silicon nitride oxide film.

4. The semiconductor device according to claim 1, wherein the oxide semiconductor film includes at least one of oxides of indium, zinc, gallium, zirconium, tin, gadolinium, titanium, and cerium.

5. The semiconductor device according to claim 1, wherein an average surface roughness of the gate insulating film is less than or equal to 1 nm.

6. A display device comprising a transistor, the transistor comprising:
   a gate electrode;
   a gate insulating film comprising a silicon nitride oxide film over the gate electrode, a silicon oxynitride film over the silicon nitride oxide film, and a metal oxide film over the silicon oxynitride film;
   an oxide semiconductor film over and in contact with the metal oxide film;
   a source electrode and a drain electrode over the oxide semiconductor film; and
   a protective film over and in contact with the oxide semiconductor film, the source electrode, and the drain electrode,
   wherein the oxide semiconductor film comprises a c-axis aligned crystalline oxide semiconductor,
   wherein the oxide semiconductor film is an In—Ga—Zn-based oxide film, and
   wherein the metal oxide film is a Ga—Zn-based oxide film.

7. The display device according to claim 6, wherein the silicon nitride oxide film has a larger thickness than the silicon oxynitride film.

8. The display device according to claim 6, wherein the metal oxide film has a smaller thickness than the silicon nitride oxide film.

9. The display device according to claim 6, wherein the display device comprises a liquid crystal element.

10. The display device according to claim 6, wherein the display device comprises an organic electroluminescent element.

* * * * *